(12) United States Patent
Volpe et al.

(10) Patent No.: US 10,949,321 B1
(45) Date of Patent: Mar. 16, 2021

(54) OPERATIONAL MANAGEMENT OF A DEVICE

(71) Applicant: Amazon Technologies, Inc., Seattle, WA (US)

(72) Inventors: Thomas A. Volpe, Austin, TX (US); Alwood Patrick Williams, III, Spicewood, TX (US); Brian Robert Silver, Austin, TX (US)

(73) Assignee: Amazon Technologies, Inc., Seattle, WA (US)

( * ) Notice: Subject to any disclaimer, the term of this patent is extended or adjusted under 35 U.S.C. 154(b) by 179 days.

(21) Appl. No.: 16/200,620

(22) Filed: Nov. 26, 2018

(51) Int. Cl.
  *G06F 11/30* (2006.01)
  *G06F 11/34* (2006.01)
  *G01R 31/317* (2006.01)
  *G06F 11/07* (2006.01)

(52) U.S. Cl.
  CPC .... *G06F 11/3452* (2013.01); *G01R 31/31705* (2013.01); *G06F 11/0709* (2013.01); *G06F 11/0751* (2013.01); *G06F 11/0772* (2013.01); *G06F 11/0793* (2013.01); *G06F 11/3006* (2013.01); *G06F 11/3065* (2013.01)

(58) Field of Classification Search
  CPC .. G06F 11/34; G06F 11/3409; G06F 11/3419; G06F 11/3433; G06F 11/3452
  USPC .......................................... 714/47.1, 47.2, 37
  See application file for complete search history.

(56) References Cited

U.S. PATENT DOCUMENTS

| | | | |
|---|---|---|---|
| 7,379,860 B1* | 5/2008 | Bartz | G06F 11/3636 703/14 |
| 7,681,078 B2 | 3/2010 | Moyer | |
| 7,865,771 B2 | 1/2011 | Yang | |
| 8,095,917 B2 | 1/2012 | Stall | |
| 9,104,599 B2 | 8/2015 | Atkisson et al. | |
| 2008/0010621 A1 | 1/2008 | Williams | |
| 2009/0049312 A1* | 2/2009 | Min | G06F 1/3228 713/300 |
| 2010/0332909 A1 | 12/2010 | Larson | |
| 2012/0124047 A1* | 5/2012 | Hubbard | G06F 16/332 707/737 |
| 2013/0346594 A1* | 12/2013 | Banerjee | G06F 11/3495 709/224 |
| 2014/0305525 A1* | 10/2014 | Le Moing | F16K 37/0083 137/553 |

(Continued)

OTHER PUBLICATIONS

"Embedded Trace Buffer", Texas Instruments Wiki, Available online at: https://processors.wiki.ti.com/index.php/Embedded_Trace_Buffer, 10 pages, Mar. 2, 2017.

(Continued)

*Primary Examiner* — Chae M Ko
(74) *Attorney, Agent, or Firm* — Kilpatrick Townsend & Stockton LLP

(57) ABSTRACT

Operational management of an integrated circuit device can be performed by a microcontroller based on information associated with the notification messages generated by the integrated circuit device. The notification messages may include timestamps and metadata for different notification types which can be used to build a timeline. The microcontroller may use the information to monitor the operational health and performance of the integrated circuit device or can communicate this information to a remote management server.

19 Claims, 9 Drawing Sheets

(56) References Cited

U.S. PATENT DOCUMENTS

| | | |
|---|---|---|
| 2015/0100767 A1 | 4/2015 | Topham |
| 2015/0100842 A1 | 4/2015 | Rao et al. |
| 2016/0142940 A1* | 5/2016 | Teo .................. H04W 48/20 370/235 |
| 2017/0083434 A1 | 3/2017 | Potash |
| 2017/0083464 A1 | 3/2017 | Potash |
| 2018/0365017 A1 | 12/2018 | Shirvani et al. |

OTHER PUBLICATIONS

U.S. Appl. No. 16/145,050, "U.S. Patent Application No.", Notifications in Integrated Circuits, Sep. 27, 2018.
U.S. Appl. No. 16/216,873, filed Dec. 11, 2018 Titled "Execution Synchronization and Tracking".
U.S. Appl. No. 16/216,855, filed Dec. 11, 2018 Titled "Event-Based Device Performance Monitoring".
U.S. Appl. No. 16/146,834, filed Sep. 28, 2018 Titled "Reconfigurable Instruction".
U.S. Appl. No. 16/200,602, filed Nov. 26, 2018 Titled "Configurable Reporting for Device Conditions".

* cited by examiner

OPERATIONAL MANAGEMENT OF A DEVICE

BACKGROUND

Computer systems may encounter different types of errors during runtime operations which can affect their performance and availability. These errors may be caused due to problems in the hardware or in the code being executed by different devices in the system. Generally, the errors may cause an interrupt to the main processor which may have to halt other operations to service the interrupt. In some cases, a device may need to be taken offline to debug the problem.

BRIEF DESCRIPTION OF THE DRAWINGS

Various embodiments in accordance with the present disclosure will be described with reference to the drawings, in which.

DETAILED DESCRIPTION

Figure 1:
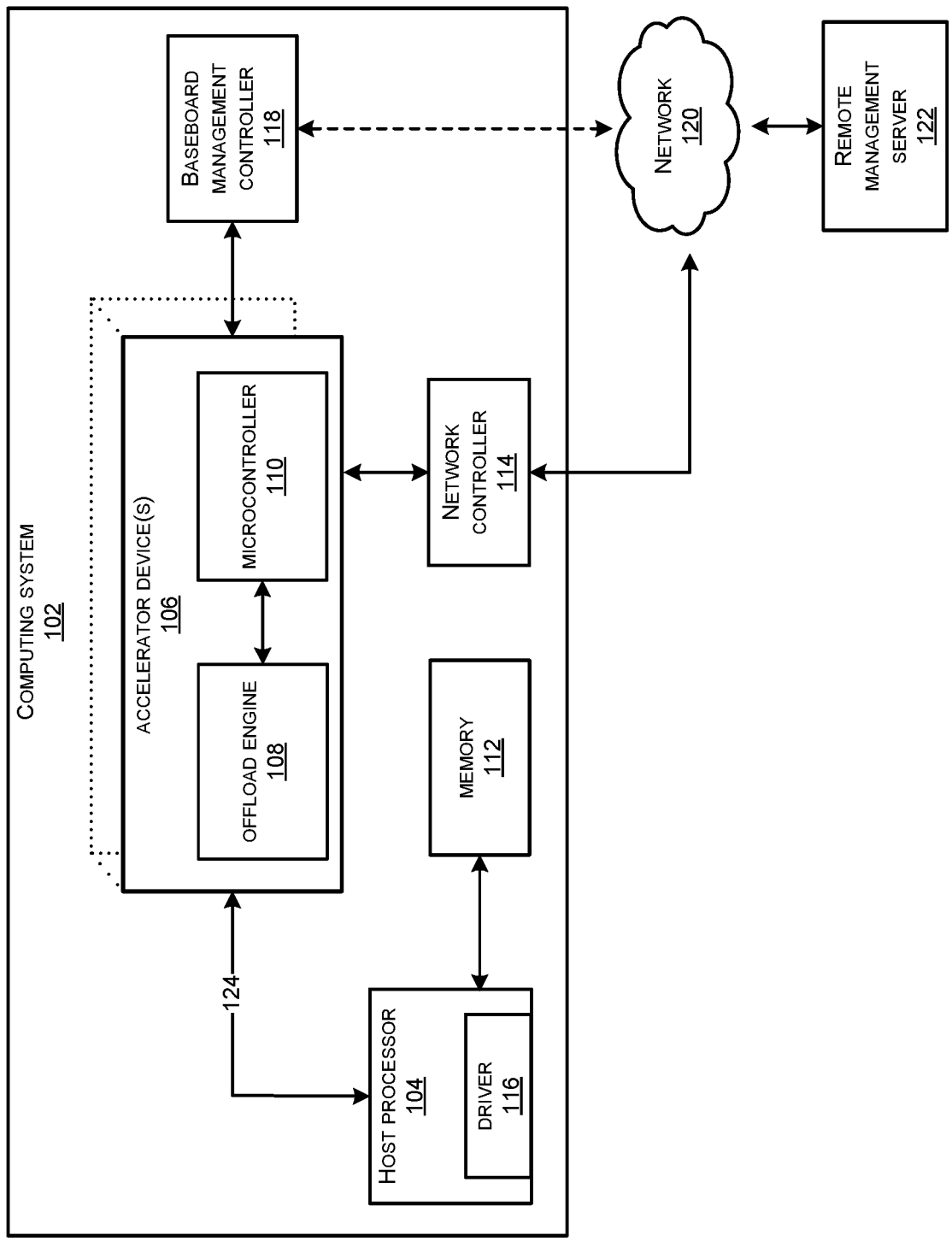
FIG. 1 illustrates an operational management system configured to provide operational management for a computing system in certain embodiments of the disclosed technologies.

Cloud computing provides a way to access servers, storage, databases, and various application services over a network. One of the goals for the cloud service providers is high availability and performance of the servers that host these services and applications. High availability may correspond to a higher uptime so that users using these services can access the services without interruption. Additionally, performance may correspond to a faster response time of the servers which may be desirable for most of the applications. However, during runtime operations, the servers may encounter different types of errors which can affect their performance and availability. The errors may be caused due to problems in the hardware or in the code being executed by different devices in the server. Generally, the errors may cause an interrupt to the main processor which may have to halt other operations to service the interrupt. In some cases, a device or a server may need to be taken offline to debug the problem. These scenarios can increase the system downtime, cause interruption in the service, or affect the system performance, thus impacting the services provided to the users.

In various examples, servers hosting cloud services may be maintained and managed by a fleet management software executing on a remote server. The fleet management software may be operable to configure various integrated circuit devices in each server to perform specific tasks. In various implementations, each server may include a computing system comprising a host processor, which may be responsible for overall management and control of the computing system, including executing the computing system's operating system. The computing system may also include other processors such as a floating point processor, graphics processor, neural network processor, or another special purpose processor, which may be capable of executing program code to perform specific functionalities. In some implementations, the processor may include an accelerator designed to perform certain functions more efficiently than when these operations are performed by the host processor. The accelerator can thus offload these operations from the host processor, so that the host processor can be free to perform other operations. For example, the accelerator can execute program code to perform floating point calculations or graphics rendering more efficiently and thus can offload these operations from the host processor. Similarly, a data movement processor can execute program code to orchestrate movement of data within the computing system more efficiently, and thus can offload these operations from the host processor.

In various embodiments, a plurality of such accelerators and data movement processors may be part of the computing system to accelerate operation of the system and improve performance. As an example, a set of accelerators may be used to perform neural network computations and a set of data movement processors may be used to manage movement of data within the computing system. Data movement within the computing system may include, for example, moving data between network interfaces, hard drives, accelerators, and processor memory, among other locations. The plurality of such accelerators and data movement processors may communicate with the host processor via a peripheral component interface express (PCIe) interface or another suitable interface. Activities of various accelerators, data movement processors, and other components in the computing system can be synchronized using events. An event can be set or cleared by changing the status of a register.

Each of the accelerators and the data movement processors may be implemented as integrated circuits. According to certain embodiments, the plurality of such accelerators and data movement processors, in addition to some support logic (for example, DMA controllers, memory controllers, etc.), can be incorporated into a larger integrated circuit device, which, herein, is termed as an offload engine. As an example, the offload engine may be implemented as a System on a Chip (SoC). In some implementations, a microcontroller may be coupled to the offload engine to configure and manage various components of the offload engine. As an example, the microcontroller and the offload engine may be part of an add-on card or an expansion card (e.g., a PCIe card). A plurality of such cards can be inserted in or connected to the host server motherboard in larger systems. The fleet management software may configure each card through its respective microcontroller to perform specific functionalities.

In some implementations, each integrated circuit may include registers to store information associated with runtime operations of the integrated circuit. The registers may include status registers to store runtime status (e.g., current execution state or current timestamp) of the circuit. The registers may also include statistics registers to store statistics associated with various runtime operations of the circuit. For example, the statistics registers may store counts for the number of instructions executed, number of interrupts, number of cycles in running state, number of cycles in waiting state, number of write transactions performed, etc. The integrated circuit may include a first set of status and statistics registers which may be accessible by the host processor, and a second set of status and statistics registers which may be accessible by the microcontroller. In some embodiments, the microcontroller may have higher privileges than the host processor. The integrated circuit may be configured to generate a first notification message to be sent to the host processor and a second notification message to be sent to the microcontroller. The notification message may be generated during runtime operation of the integrated circuit upon detection of an error, setting or clearing of an event, change in physical health parameters, or execution of a specific instruction. The runtime operation may correspond to an execution state of the integrated circuit. The notification message may include a timestamp indicating a point in time the notification message was generated, a notification type indicating a type of the notification message, and metadata based on the notification type. For example, the metadata may identify an error or an event that caused the generation of the notification message.

The microcontroller may be configured to access information associated with the notification message to perform the operational management of the computing system. For example, the microcontroller may access the timestamp, the notification type, and the metadata related to an error or an event that caused the notification message. The microcontroller may also read one or more status and statistics registers in the integrated circuit based on the notification type and the metadata. In some examples, accessing the information may include accessing data collected over a period of time based on the information associated with each notification message received over the period of time. The microcontroller may be further configured to determine that the integrated circuit is not operating within a threshold based on a timeline built using the collected data. As an example, the timeline may be built by sorting the notification messages using timestamps. The microcontroller may communicate with a remote management server based on the information. For example, if the information indicates occurrence of a large number of errors within a short time period based on the timeline, or that a particular accelerator is not active, the microcontroller may send that information to the remote management server executing the fleet management software so that appropriate actions may be taken. For example, the remote management server may send reconfiguration information to take the accelerator offline and redistribute the user workload, or to reconfigure the particular accelerator.

In various examples, the threshold may be based on the performance of the integrated circuit or the operational health of the integrated circuit. For example, the performance may indicate that the integrated circuit is able to execute a certain number of instructions within a given time period, is not idling or waiting for an extended period of time, not getting frequently interrupted, etc. The operational health may indicate that the server is not getting too many hardware errors. The hardware errors may correspond to ECC errors, errors related to change in physical health parameters (e.g., temperature, airflow, voltage drop, etc.), or other suitable hardware errors.

The timeline may be built by the microcontroller or by the remote management server using the timestamps in the notification messages received over a period of time. In one embodiment, a portion of the collected data may be sent to the remote management server for analysis. The remote management server may build the timeline using the collected data, perform the analysis, and determine new configuration values for the integrated circuit. The new configuration values may be used by the remote management server or the microcontroller for reconfiguring the integrated circuit. In some examples, reconfiguring may include resetting the integrated circuit or writing one or more registers in the integrated circuit. In another embodiment, the microcontroller may build the timeline using the collected data, send the timeline to the remote management server for analysis, and use the new configuration values provided by the remote management server as a result of the analysis to reconfigure the integrated circuit. In some instances, monitoring the operation of the integrated circuit proactively using the notification messages or reading the statistics registers periodically may help detect an error before or right after it occurs so that the user impact can be minimized. In other instances, performance of the system can be improved by reconfiguring the system.

Thus, in certain embodiments, use of the notification messages can provide information associated with the runtime operations of the integrated circuit devices in a computing system, which can be used by a microcontroller or the fleet management software to monitor the operational and physical health of the integrated circuit devices. Additionally, as compared to an interrupt, the notification message may not need immediate attention of the microcontroller, and can be handled whenever the microcontroller has time to read the notification message. Furthermore, some embodiments can be used to debug a failing or faulty integrated circuit device while other devices are still in use and operational, thus minimizing the system downtime.

In the following description, various examples will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

FIG. 1 illustrates an operational management system 100 configured to provide operational management for a computing system 102, in certain embodiment of the disclosed technologies. In some examples, the computing system 102 may be part of a server configured to provide cloud computing services to various clients.

The host processor 104 of this example can be a general purpose processor for executing program instructions. The host processor 104 can also be referred to as the computing system's primary processor, and/or as a Central Processing Unit (CPU). The host processor 104 can be implemented using an integrated circuit. In some examples, the host processor 104 can include multiple processing cores. In some examples, the computing system 102 can include more than one host processor, possibly working in a coordinated manner.

The host processor 104 may be responsible for the overall management and control of the example computing system 102, including executing the computing system's operating system. Operations that the host processor 104 may be responsible for include, for example, executing programs such as device drivers that manage other hardware components in the computing system 102, and processing or responding to input from users or other computing systems, among other examples. In the illustrated example, the host processor 104 may execute a driver 116 to configure and manage operations of one or more accelerator devices 106. The host processor 104 and the accelerator devices 106 may communicate with each another using an interface 124.

A memory 112 may be accessible by the host processor 104 or the accelerator device(s) 106. In some examples, the accelerator devices 106 may access the memory 112 via the interface 124. The memory 112 may be a Dynamic Random Access Memory (DRAM), though other volatile memory technologies can be used, including, for example, Static RAM (SRAM), Synchronous Dynamic RAM (SDRAM), and Double Data Rate Synchronous Dynamic RAM (DDR), among others. In various examples, non-volatile memory types, such as Flash-based memory, can be used for the memory 112.

The computing system 102 may include a plurality of accelerator devices 106 coupled to the host processor 104 via the interface 124. The interface 124 may include a peripheral component interconnect express (PCIe) interface or another version of the PCI protocol. The accelerator device 106 may be designed to perform certain functions, such as floating point calculations or graphics rendering, more efficiently and can be configured to offload these operations from the host processor 104, so that the host processor 104 can be free to perform other operations. Each accelerator device 106 may include an offload engine 108 and a microcontroller 110. In some implementations, each accelerator device 106 may be on a respective expansion card or an add-on card in the server, for example, a PCIe card. The PCIe card may include other devices on the card, which are not shown in FIG. 1. In some examples, the PCIe card may include various sensors, voltage regulators, clock controllers, and any other devices to monitor physical health of the card. The sensors may be used to monitor temperature, airflow, humidity, and other physical health parameters of the card which may affect operation of the card.

The offload engine 108 is an example of an integrated circuit where data may frequently be moving into and out of the offload engine 108. This movement of data can be managed by one or more data management processors. The offload engine 108 may also include one or more accelerators, each of which can perform certain types of operations much faster than when similar operations are performed by a general purpose processor. Examples of accelerators that can be included in the offload engine 108 may include graphics accelerators, floating point accelerators, neural network accelerators, and others. In various examples, to perform a set of operations, input data on which the operations are to be performed is first moved into the accelerators. Additionally, in some cases, program code is also moved into the accelerators, which programs the operations that the accelerators will perform on the data. This movement of the input data and the program code into the accelerators may be managed by the one or more data management processors in the offload engine 108.

In various embodiments, each accelerator and each data movement processor may include a respective set of registers. The registers may include a first set of configuration registers, control and status registers (CSRs), and statistics registers accessible by the host processor 104, and a second set of configuration registers, CSRs, and statistics registers accessible by the microcontroller 110. The driver 116 executing on the host processor 104 may configure the first set of configuration registers to allocate memory, enable error reporting, etc. Similarly, the microcontroller 110 may configure the second set of configuration registers to allocate memory, enable error reporting, etc. Each set of statistics registers may be used to store information associated with the runtime operation of the integrated circuit. In some examples, the statistics registers may store counts for various operations executed by the respective integrated circuit, for example, counts for the number of interrupts generated, number of instructions executed, number of errors detected, number of cycles in wait state, number of cycles in running state, or other relevant counts since the last read of the respective register. For example, each statistics register may be reset to zero at power up and after each read of the register.

In various embodiments, each accelerator and each data movement processor may also be configured to generate respective notification messages during their respective runtime operations. For example, a first notification message may be sent to a queue in memory accessible by the host processor 104 and a second notification message may be sent to another queue in memory accessible by the microcontroller 110. Each notification message may be generated upon detection of an error, setting or clearing of an event, change in physical health parameters, or execution of a specific instruction in the integrated circuit. The notification message may include a timestamp indicating a point in time the notification message was generated, a notification type indicating a type of the notification message, and metadata based on the notification type. For example, the metadata may identify an error or an event that caused the generation of the notification message.

The microcontroller 110 may be used to configure and perform the operational management of the offload engine 108. As an example, the microcontroller 110 may include one or more processor cores configured to execute firmware for configuring and managing the offload engine 108. In some implementations, once the PCIe card is powered up, the microcontroller 110 may configure certain registers in the offload engine 108 to initialize various integrated circuits in the offload engine 108. The microcontroller 110 and the offload engine 108 may communicate with one another using a serial peripheral interface (SPI), or another suitable interface. In some instances, the microcontroller 110 may run some test programs to verify default operations of various components of the offload engine 108. Once the PCIe card is up and running, it can be used to run user workload. The microcontroller 110 can perform monitoring of the PCIe card in the background by waiting for interrupts from physical sensors, periodically reading statistics registers, or polling notification queues to collect statistics for various runtime operations. The microcontroller 110 may provide the status of the accelerator device to a remote management server 122 over a network 120.

The microcontroller 110 may be coupled to the network 120 via a network controller 114. The network controller 114 may be configured to provide network connectivity to allow the microcontroller 110 to communicate with the remote management server 122 over the network 120. The network 120 may utilize transmission control protocol (TCP), Internet Protocol (IP), or any suitable protocol to enable communication with the remote management server 122. In some implementations, the network controller 114 may include a network interface card (NIC) and the microcontroller 110 may include Ethernet connectivity to the network controller 114. The network controller 114 may further include Ethernet connectivity to the remote management server 122. In some embodiments, the microcontroller 110 may communicate with the remote management server 122 over the Ethernet using an API based protocol, for example, constrained application protocol (CoAP), or REST. However, other methods of communications between the microcontroller 110 and the remote management server 122 are possible within the scope of the disclosed technologies.

The remote management server 122 may be configured to provide fleet management services for the cloud. As an example, the remote management server 122 may execute fleet management software to configure and manage the servers in the cloud. The remote management server 122 may assign appropriate workloads to different servers based on the users' applications. For example, each server may include a computing system, similar to the computing system 102, which may comprise multiple accelerators and data movement processors. In various examples, a server may be running a neural network application while another server may be running a search engine. The fleet management software may provide information to the microcontroller 110 to reconfigure a particular accelerator, shut down the accelerator, change the number of accelerators or data movement processors that are active, reconfigure the DRAM channels, or reassign workloads among accelerators or servers based on information received from the microcontrollers from the respective computing systems.

The baseband management controller (BMC) 118 may be a special purpose processor which can determine physical health of the computing system 102 using sensors for monitoring heat, voltage, humidity, airflow, etc., of the accelerator device 106. As an example, the BMC 118 may reside on the server motherboard in the computing system 102. The BMC 118 may communicate with the microcontroller 110 using a system management bus (SMbus) or any suitable bus protocol. In some implementations, the BMC 118 may include network connectivity to communicate with the remote management server 122 via the network 120 information related to physical health of the integrated circuit. In other implementations, the BMC 118 and the network controller 114 may be integrated as one device. The BMC 118 may provide physical health parameters to the microcontroller 110 or to the remote management server 122 periodically or when the parameters are outside a certain range. The microcontroller 110 may use the physical health parameters provided by the BMC 118 in addition to the physical health parameters from the PCIe board to determine the physical health of the accelerator device 106. The computing system 102 may also include other input/output (I/O) devices and hardware for connecting to user input and output devices, such as keyboards, monitors, and printers, which are not shown in FIG. 1 for ease of illustration.

The microcontroller 110 may be configured to read or write certain addresses in the offload engine 108, which can enable the microcontroller 110 to configure the offload engine 108, and read various status or statistics registers in the offload engine 108. The microcontroller 110 may aggregate the information related to the operational and physical health of the offload engine 108 over a period of time. The microcontroller 110 may determine whether the offload engine 108 is operating or performing as expected based on the aggregated information, or send a portion or all of the aggregated information to the remote management server 122 for further analysis. The remote management server 122 may reconfigure a particular accelerator, shut down the accelerator, or reassign workloads among accelerators or servers based on the aggregated information.

In certain embodiments, the microcontroller 110 may be configured to monitor operational and physical health of the offload engine 108 based on information associated with the notification messages. Each notification message may include a notification type, metadata based on the notification type, and a timestamp. The information associated with the notification messages may include contents of the notification messages, values of certain CSRs and statistics registers, or data collected over a period of time based on the metadata and the notification type. For example, the microcontroller 110 may read or write certain addresses in the offload engine 108, which can enable the microcontroller 110 to configure the offload engine 108, and read various status or statistics registers in the offload engine 108. For example, the microcontroller 110 may determine if the accelerator is active or not by reading a current execution state of an accelerator in a CSR. The microcontroller 110 may collect the data related to the operational and physical health of the offload engine 108 over a period of time. The microcontroller 110 may determine whether the offload engine 108 is operating or performing within a threshold based on the collected data, or send a portion of the collected data to the remote management server 122 for further analysis. In some instances, the collected data may be used to build a timeline based on the timestamps in the notification messages. As an example, the timeline may be built by sorting the notification messages using timestamps. The timeline may be used to help debug any problems contributing to unexpected behavior of the acceleration engine or to improve performance.

The microcontroller 110 may be further configured to report to the remote management server 122 via the network 120 upon determining that an accelerator is not operating as expected. The remote management server 122 may reset the accelerator, or take that accelerator offline and reassign the job to another accelerator. In some instances, the remote management server 122 may reassign or reconfigure one or more components of the computing system 102. For example, in some examples, the microcontroller 110 may periodically read the CSRs and statistics registers to determine whether the accelerator is performing as expected. Thus, certain embodiments can proactively identify a problem in the offload engines 108 before it occurs, or can resolve the problem right after it occurs by monitoring certain components of the offload engines 108. This can help provide a better experience to the users by insulating the users from experiencing the problems caused due to faulty devices or devices not performing optimally.

Figure 2:
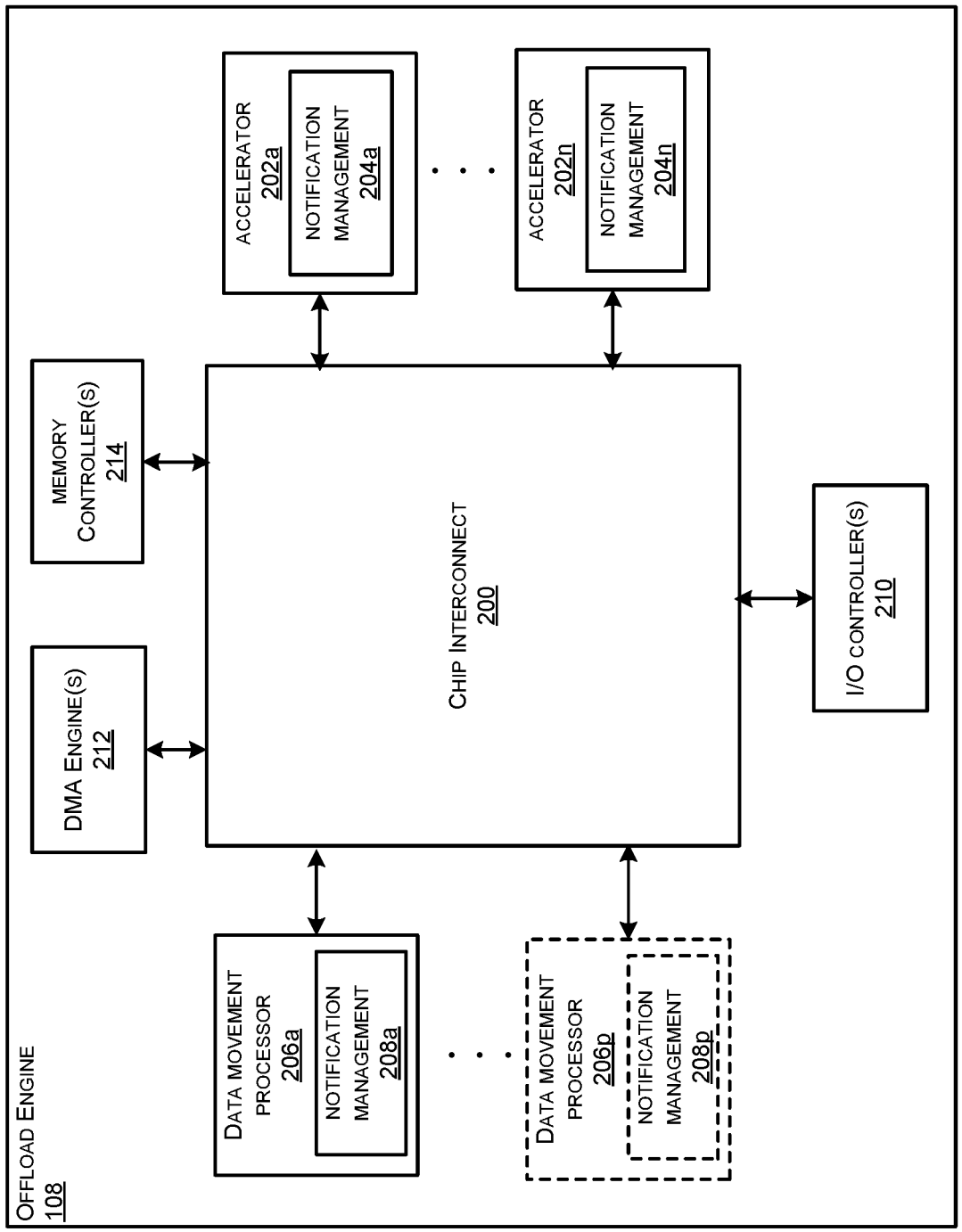
FIG. 2 illustrates a block diagram for an acceleration engine in one embodiment.

FIG. 2 illustrates a block diagram for the offload engine 108 in one embodiment. Each accelerator device 106 in FIG. 1 may include the offload engine 108.

The offload engine 108 may include accelerators 202a-202n, data movement processors 206a-206p, one or more input/output (I/O) controllers 210, DMA engines 212, and memory controllers 214. The offload engine 108 is an example of an integrated circuit where data may frequently be moving into and out of the offload engine 108. This movement of data can be managed by the one or more data movement processors 206a-206p. In this example, the data movement processors 206a-206p and the accelerators 202a-202n are part of the same integrated circuit or die. In other examples, the data movement processors 206a-206p can be on a separate device.

In the example of FIG. 2, the offload engine 108 may include multiple accelerators 202a-202n, each of which can perform a set of operations. In various examples, the accelerators 202a-202n used for particular types of operations can perform the operations much faster than when similar operations are performed by a general purpose processor. In some implementations, to perform a set of operations, input data on which the operations are to be performed is first moved into the accelerators 202a-202n. Additionally, in some cases, program code can also be moved into the accelerators 202a-202n, which programs the operations that the accelerators 202a-202n may perform on the data. The accelerators 202a-202n may include graphics accelerators, floating point accelerators, neural network accelerators, or other types of accelerators.

The memory controllers 214 may be used for communicating with an external memory. In some examples, the external memory may include the memory 112 in FIG. 1. The external memory can be implemented using dynamic random access memory (DRAM) or other suitable memory. In some implementations, the offload engine 108 may include a set of memory controllers, each of which may be able to communicate with an independent set of banks of DRAM. In other examples, other types of RAM technology can be used for the external memory. In various examples, input data and/or program code for the accelerators 202a-202n can be stored in the external memory. In various examples, different accelerators 202a-202n can be programmed with different programs, so that each accelerator performs a different set of operations. For example, when one of the accelerators is a neural network accelerator, one program can configure the neural network accelerator to perform speech recognition while another program can configure the neural network accelerator to perform image recognition. In various examples, the data movement processors 206a-206p can manage moving the program code from the external memory to the accelerators 202a-202n.

The one or more I/O controllers 210 may be used for communicating with one or more I/O devices or the host processor 104 in the computing system 102. The offload engine 108 can communicate with the I/O devices or the host processor 104 using a processor bus. In some examples, the processor bus can be a Peripheral Component Interconnect (PCI) bus and/or a variation of the PCI bus protocol, or any suitable standardized bus protocol. In other examples, a proprietary bus protocol can be used. The processor bus can connect the offload engine 108 to the I/O devices such as, for example, input and output devices, and storage devices, among other things. In some examples, the I/O controllers 210 can enable the offload engine 108 to act as an I/O device for the host processor 104. For example, the offload engine 108 can be the recipient of input data from the host processor 104, and a command indicating an operation to be performed on the input data (e.g., a particular computation or analysis). In some examples, the offload engine 108 may include multiple I/O controllers 210, each of which may include a separate root complex and may communicate with a separate set of I/O devices.

In some examples, the data movement processors 206a-206p can manage the movement of data between the I/O devices, the accelerators 202a-202n, or the memory 112. For example, input data or the program code may be located at an I/O device or in the memory 112, and one or more data movement processors 206a-206p can manage the movement of the input data or the program code from the I/O device or the memory 112 into an accelerator from the accelerators 202a-202n.

In some examples, the offload engine 108 may further include one or more DMA engines 212 that can move data between the accelerators 202a-202n, one or more memory controllers 214, and the one or more I/O controllers 210. In some implementations, the DMA engines 212 can be assigned to specific tasks, such as moving data from the memory controllers 214 to the accelerators 202a-202n, or moving data between the I/O controllers 210 and the accelerators 202a-202n. These tasks can be assigned, for example, by enqueuing descriptors with the DMA engines 212, where a descriptor identifies an address for a block of data and an operation (e.g., a read or a write) to perform. A descriptor, for example, can direct a DMA engine to instruct a DMA controller to read a block of data from the memory 112. A descriptor can, as a further example, instruct the DMA engine to write data, read by the DMA controller, to an accelerator. Further descriptors can be used to move data from an accelerator to the memory 112.

In various examples, each of the data movement processors 206a-206p can be responsible for managing the data movement for a different accelerator. Each of the data movement processor 206a-206p may be a type of an integrated circuit that can execute program code for orchestrating the movement of data within the computing system 102. The program code may be stored in an instruction memory in the data movement processor. In some examples, a single data movement processor may manage the data movement for more than one accelerator. Similarly, in various examples, each of the data movement processors 206a-206p can be assigned to one or more DMA engines 212. In these and other examples, associations between the data movement processors 206a-206p, accelerators 202a-202n, and the DMA engines 212 can be determined by the program code being executed by each respective data movement processor. In some embodiments, events may be used to synchronize data movement among the DMA engines 212, data movement processors 206a-206p, and the accelerators 202a-202n.

In the example offload engine 108, the various components can communicate over a chip interconnect 200. The chip interconnect 200 may primarily include wiring for routing data between the components of the offload engine 108. In some cases, the chip interconnect 200 may include a minimal amount of logic, such as multiplexors to control the direction of data, flip-flops for handling clock domain crossings, and timing logic.

In certain embodiments, each of the accelerators 202a-202n and the data movement processors 206a-206p may include a respective notification management circuit to generate one or more notification messages that can be used to perform operational management of the accelerator device 106. For example, the accelerators 202a-202n may include a respective notification management circuit 204a-204n, and the data movement processors 206a-206p may include a respective notification management circuit 208a-208p. Each of the notification management circuit may be configured to generate respective one or more notification messages which may be used by a respective microcontroller to monitor operational and physical health of the accelerator device 106.

In various examples, a notification message can include information such as a notification type, a timestamp indicating when the notification was generated, and metadata comprising information about an internal status of the integrated circuit based on the notification type. The integrated circuit may be able to output different types of notification messages, using the same notification generator circuitry. For example, the integrated circuit can support an explicit notification instruction, which, when decoded and executed by the integrated circuit, can cause the integrated circuit to output a notification message with some information about the code being executed by the integrated circuit. As another example, the integrated circuit can include an event mechanism, which the integrated circuit can use to determine whether certain operations at other devices or locally have occurred. In this example, the event mechanism can output notification messages when a change in the status of an event occurs internal or external to the integrated circuit. As another example, the device can output notification messages when certain errors occur, such as incorrect behavior of the hardware or of the code being executed by the integrated circuit.

A notification message, as described herein, can enable an integrated circuit device to output information about the internal status of the device, without having to conduct time consuming I/O operations. Additionally, the integrated circuit device can use a single time source for adding timestamps to the notification messages, so that the notification messages can be used to reconstruct a timeline of the operation of the integrated circuit device. The notification mechanism can enable visibility into the operation of the integrated circuit device, provide debugging information about both the hardware and the execution of software code, and an ability to measure the performance of the integrated circuit device, as well as other uses. An example notification management circuit, which may be used to generate one or more notification messages to provide notification management, is discussed with reference to FIG. 3.

Figure 3:
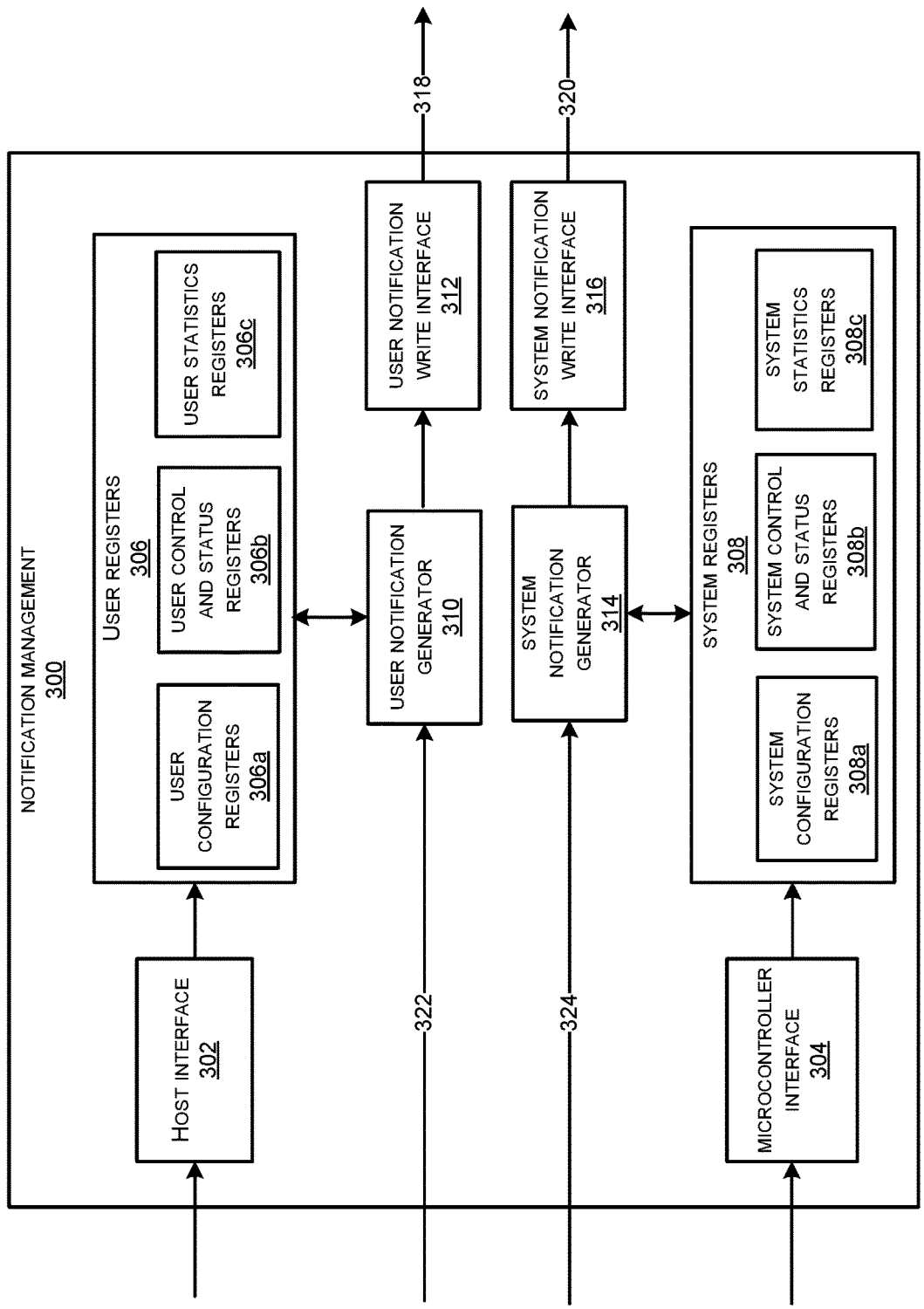
FIG. 3 illustrates a block diagram for an example notification management circuit in one embodiment.

FIG. 3 illustrates a block diagram for an example notification management circuit 300 in one embodiment. For example, each of the accelerators 202a-202n and the data movement processors 206a-206p in FIG. 2 may include the example notification management circuit 300.

The notification management circuit 300 may include a host interface 302, a microcontroller interface 304, user registers 306, system registers 308, a user notification generator 310, a user notification write interface 312, a system notification generator 314, and a system notification write interface 316.

The user registers 306 may include user configuration registers 306a, user control and status registers (CSRs) 306b, and user statistics registers 306c. The user configuration registers 306a may include registers to configure the notification queue in the memory 112 for writing the notification messages, to enable generation of notification messages for errors and events, set and clear the status for each event, among other registers. The user CSRs 306b may include registers to configure execution control, to store a current execution state, and to store a current timestamp. The user statistics registers 306c may be configured to store statistics associated with various runtime operations of the given integrated circuit (e.g., the accelerators 202a-202n or the data movement processors 206a-206p). The user statistics registers 306c may include registers to store counts for the number of instructions executed, number of write transactions performed, number of user interrupts, number of user notifications, number of events set, number of events cleared, number of errors per error condition, number of cycles in running state, number of cycles in aborted state, number of cycles in halt pending state, number of cycles due to wait on events, number of cycles in stalled state, among other counts. In some implementations, each of the user statistics registers 306c may include respective counters, which may get cleared upon reading.

The host interface 302 may be used to communicate with the host processor 104. For example, the host interface 302 may be used by the driver 116 executing on the host processor 104 to access the user registers 306. The driver 116 may use the host interface 302 to write or read the user registers 306.

The user notification generator 310 may be configured to generate a user notification message 318 based on one or more registers in the user register 306, or information 322 associated with an error or an explicit notification instruction. The user notification message 318 may include information such as a notification type, a timestamp indicating when the notification was generated, and metadata based on the notification type. The user notification message 318 may correspond to different types of notifications based on the notification type. For example, the user notification generator 310 may generate a notification message, when the explicit notification instruction is decoded and executed by the integrated circuit device, to provide some information about the code being executed by the integrated circuit device. In another example, the user notification generator 310 may generate the user notification message 318 based on an event mechanism as indicated by an event identifier in the metadata, which the integrated circuit device can use to determine whether certain operations, for example at other devices, have occurred. In this example, the event mechanism can output notification messages when a change in the status of an event register for an event occurs. In some implementations, the integrated circuit can include multiple event registers as part of the user registers 306, each of which can indicate the occurrence of a different event. In another example, the user notification generator 310 may generate the user notification message 318 when certain error occurs as indicated by an error identifier in the metadata, such as incorrect behavior of the hardware or of the code being executed by the integrated circuit device. The user notification message 318 may be generated based on whether the generation of a particular notification type is enabled in the user configuration registers 306a.

The user notification write interface 312 may provide an interface to write the user notification message 318 in the memory 112 accessible by the host processor 104. In some embodiments, different notification types may be written in different queues in the memory 112. For example, the user notification message 318 generated from an explicit instruction execution may be written in a user notification queue in the memory 112, the user notification message 318 generated from detection of an error may be written in a user error notification queue in the memory 112, and the user notification message 318 generated from an event mechanism may be written in a user event notification queue in the memory 112. The user notification queue, user error notification queue, and the user event notification queue may be configured by the driver 116 using the user configuration registers 306a. In some implementations, the user notification write interface 312 may include a write queue to store the user notification message 318 until the user notification message 318 is written in the memory 112. The driver 116 executing on the host processor 104 may use the user notification message 318 to read the user control and status registers 306b or the user statistics register 306c for debugging or performance evaluation.

The system registers 308 may include system configuration registers 308a, system CSRs 308b, and system statistics registers 308c. The system configuration registers 308a may include registers to configure an event notification queue and an error notification queue in the microcontroller 110 for writing the notification messages, to enable generation of notification messages for errors, among other registers. The system CSRs 308b may include registers to store a current execution state, and a current timestamp. In some implementations, the system CSRs 308b may be a read only mirror copy of the user CSRs 306b. The system statistics registers 308c may be configured to store statistics associated with various runtime operations of the given integrated circuit (e.g., the accelerators 202a-202n or the data movement processors 206a-206p). The system statistics registers 308c may include registers to store counts for the number of instructions executed, number of write transactions performed, number of user interrupts, number of user notifications, number of events set, number of events cleared, number of system interrupts, number of system notifications, number of cycles in running state, number of cycles in aborted state, number of cycles in halt pending state, number of cycles in stalled state, among other counts. In some implementations, each of the system statistics registers 308c may include respective counters, which may get cleared upon reading.

The microcontroller interface 304 may be configured to communicate with the microcontroller 110. In various examples, the microcontroller interface 304 may be used to access the system registers 308 by the microcontroller 110. For example, the firmware executing on the microcontroller 110 may use the microcontroller interface 304 to write or read the system registers 308.

The system notification generator 314 may be configured to generate a system notification message 320 based on one or more registers in the system register 308, or information 324 associated with an error. The system notification message 320 may include a timestamp indicating a point in time the notification message was generated, a notification type, and metadata based on the notification message. The system notification message 320 may correspond to different types of notifications. For example, the system notification generator 314 may generate the system notification message 320 based on an event mechanism as indicated by an event identifier in the metadata, which the integrated circuit device can use to determine whether certain operations, for example at other devices, have occurred. In this example, the event mechanism can output notification messages when a change in the status of an event occurs. In another example, the system notification generator 314 may generate the system notification message 320 when a certain error occurs as indicated by an error identifier in the metadata, such as incorrect behavior of the hardware or of the code being executed by the integrated circuit device. The system notification message 320 may be generated based on whether the generation of a particular notification type is enabled in the system configuration registers 308a.

The system notification write interface 316 may provide an interface to write the system notification message 320 in a microcontroller memory in the microcontroller 110. In some embodiments, different notification types may be written in different queues in the microcontroller memory. For example, the system notification message 320 generated from detection of an error may be written in a system error notification queue in the microcontroller memory, and the system notification message 320 generated from an event mechanism may be written in a system event notification queue in the microcontroller memory. The system error notification queue and the system event notification queue may be configured by the firmware executing on the microcontroller 110 using the system configuration registers 308a. In some implementations, the system notification write interface 316 may include a write queue to store the system notification message 320 until the system notification message 320 is written in the microcontroller 110. The microcontroller 110 may use the system notification message 320 to read the system control and status registers 308b or the system statistics register 308c for operational management, debugging or performance evaluation.

Figure 4:
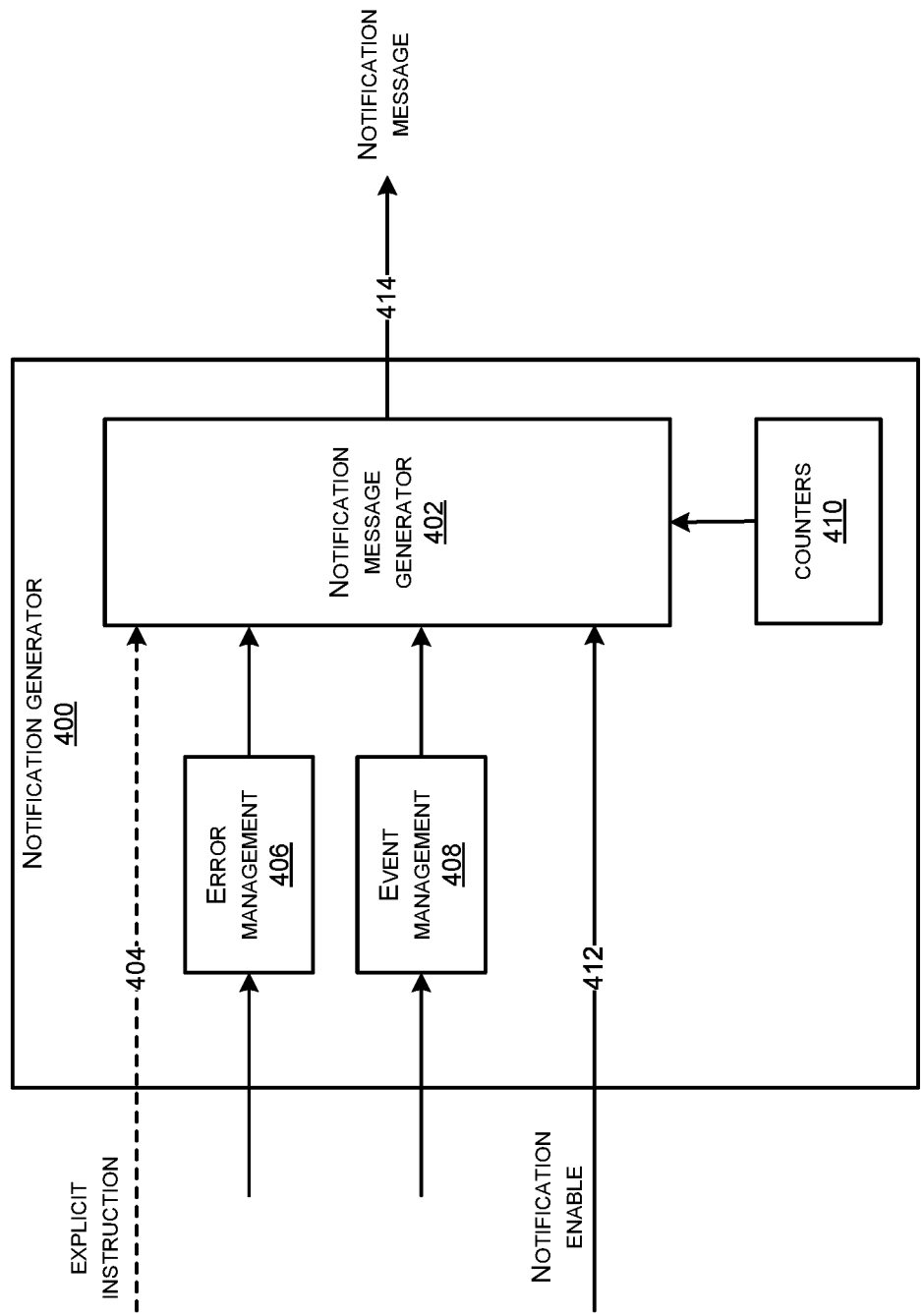
FIG. 4 illustrates a block diagram for an example notification generator in one embodiment.

FIG. 4 illustrates a block diagram for an example notification generator 400 in one embodiment. For example, the example notification generator 400 can be the user notification generator 310 or the system notification generator 308 in FIG. 3.

The notification generator 400 may include a notification message generator 402 configured to generate a notification message 414. As discussed with reference to FIG. 3, the notification message 414 may be generated based on execution of an explicit instruction 404, detection of an error by an error management 406, or detection of setting or clearing of an event by an event management 408. Generation of a type of the notification message 414 may be based on a notification enable 412 being set in the respective user configuration registers 306a or the system configuration registers 308a. For example, the notification enable 412 may be set in the respective configuration register to enable generation of the notification message 414 for a particular event or an error, or upon execution of the explicit instruction 404. The counters 410 may include a timestamp counter and other counters (e.g., loop counters, wait counters, etc.) which may be used by the integrated circuit device. The timestamp counter may count clock cycles starting at the hardware reset of the offload engine 108. The notification message generator 402 may generate the notification message 414 using the timestamp counter to include a timestamp corresponding to a point in time the notification message was generated. The notification message may also include a notification type to indicate whether the notification message corresponds to an explicit instruction execution, an error or an event, and metadata associated with the notification type. For example, the metadata may include an error identifier for the error, an event identifier for the event, or any other information. In some implementations, the counters 410 may be part of the notification message generator 402.

The event management 408 may be configured to detect the setting or clearing of an event. An event can be defined as a change in the status of an event register in the user registers 306 or the system registers 308. Thus, waiting on an event may involve watching the event register associated with the event for a change. The change can be, for example, setting of a value in the event register, or clearing (e.g., writing to zero) of the event register. In various examples, events may be set or cleared by components external to the integrated circuit, such as other integrated circuit devices in the computing system 102. For example, referring back to FIG. 2, events in the data movement processors 206a-206p may be set or cleared by the accelerators 202a-202n, DMA engines 212, or the memory controllers 214. Thus, events can be used to synchronize the activity of one component of the computing system 102 with the activity of the other components in the computing system 102. In various examples, each of the data movement processors 206a-206p and the accelerators 202a-202n can include respective event registers, each of which can indicate the occurrence of a different event. In some embodiments, generation of an event notification message upon detection of a change in the status of an event register can be enabled or disabled based on an event configuration register. For example, the event configuration register can be part of the user configuration registers 306a or the system configuration registers 308a, and can be configured by the driver 116 or the microcontroller 110. Generation of notification messages for events that are occurring occasionally can provide an indication to the microcontroller 110 that different components of the computing system 102 are active. In some examples, the microcontroller 110 may read one or more registers in the system statistics registers 308c to determine a count for the events that have been set or cleared, which can indicate that different components of the computing system 102 are active.

The error management 406 may be configured to detect an error condition in the integrated circuit. The error conditions can be a problem in the operation of the hardware of the integrated circuit, a problem in inputs received by the integrated circuit, a problem in the execution of instructions, an anomaly in physical health parameters of the integrated circuit, or another problem. As an example, the error conditions may include unknown or incorrect instruction errors, branch errors, error correction code (ECC) errors, buffer overflow errors, thermal error, voltage drop error, etc. In some embodiments, generation of an error notification message upon detection of an error can be enabled or disabled based on an error configuration register. For example, the error configuration register can be part of the user configuration registers 306a or the system configuration registers 308a, and can be configured by the driver 116 or the microcontroller 110. In some instances, generation of notification messages for errors that are occurring frequently or within a short period of time can provide an indication to the microcontroller 110 about possible problems with a faulty component of the computing system 102 so that timely action can be taken and user impact can be minimized.

In one example, use of the explicit instruction 404 to generate the notification message 414 may be optional. For example, the explicit instruction 404 may be used, in addition to the error management 406 and the event management 408, to generate the user notification message 318 in the user notification generator 310 in FIG. 3. However, the system notification message 320 may be generated only based on the detection of an error by the error management 406, or detection of setting or clearing of an event by the event management 408. An example notification message is discussed with reference to FIG. 5.

Figure 5:
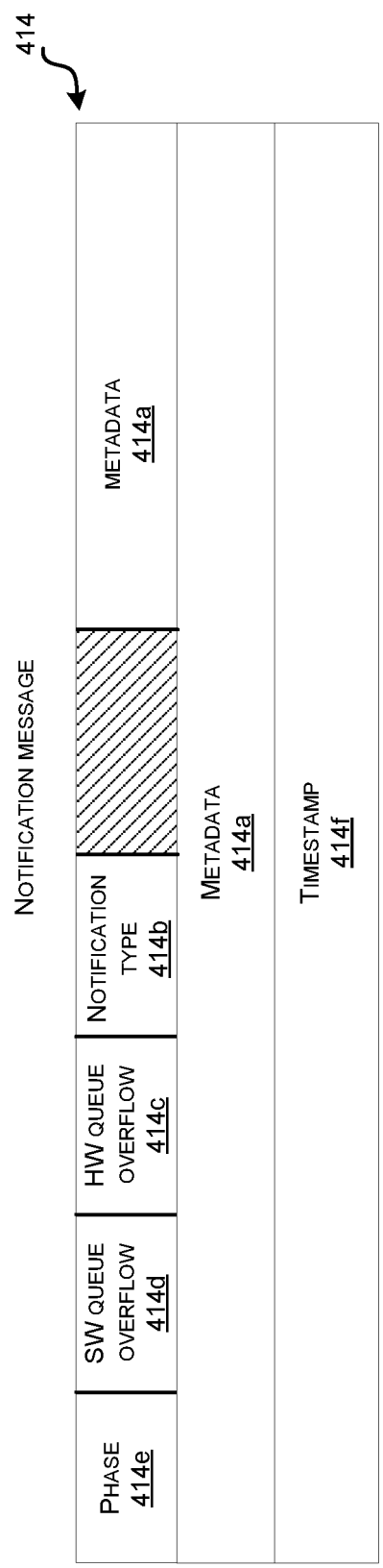
FIG. 5 illustrates an example format for a notification message according to one embodiment.

FIG. 5 illustrates an example format for the notification message 414 according to one embodiment. The diagram is being provided to illustrate one example format for notification messages, with the understanding that other formats, which can provide similar or different information, are possible. In various examples, an integrated circuit comprising a processor, such as the accelerator 202a-202n or the data movement processor 206a-206p, as illustrated in FIG. 2, can use the example format 414 to compose a notification message. As discussed further below, the example format 414 can be used to define more specific notification message formats. In the example of FIG. 5, the notification message 414 can be 32 bits wide and may include a total of 128 bits. In other examples, the format can include more or fewer total bits. The notification message 414 may comprise metadata 414a, a notification type 414b, a hardware (HW) queue overflow bit 414c, a software (SW) queue overflow bit 414d, a phase bit 414e, and a timestamp 414f. The notification message 318 may also include some reserved fields.

The notification type 414b field may indicate a type or classification for the notification message 414. For example, the notification type 414b field may indicate a first value (e.g., 1) for the error notification message and a second value (e.g., 2) for the event notification message. In some implementations, different queues can be used to store notifications of different types. For example, a queue can be designated for storing error notification messages, and another queue can be designated for storing event notification messages. The metadata 414a field can be used to provide information that is specific to notifications of different types. In some examples, the content of the metadata 414a can be determined by the value in the notification type 414b field. In some examples, the content of the metadata 414a may be partially determined by the notification type 414b field, and may further be determined by values stored in the metadata 414a. As an example, the metadata 414a field for an error notification message may be different than for an event notification message.

In some examples, the metadata 414a field for an error notification message may include an error identifier, a counter identifier, and a counter value. The error identifier may indicate a type of the error detected in the integrated circuit. The error may be a fatal error or a non-fatal error. As an example, a first value for the error identifier may indicate a correctable ECC error, a second value may indicate a non-correctable ECC error, a third value may indicate a forward branch error, a fourth value may indicate a backwards branch error, a fifth value may indicate a queue overflow error, a sixth value may indicate a queue disabled error, a seventh value may indicate a wait instruction timeout error, an eighth value may indicate a thermal error, and so on. In some embodiments, the error identifier may be used by the microcontroller 110 to track different types of errors encountered by the integrated circuit for purposes of debugging or performance monitoring. As an example, if a particular type of error is encountered frequently as indicated by the associated timestamps, it may be a sign of a problem which has already occurred or is going to occur so that appropriate and timely actions may be taken. For example, a correctable ECC error occurring frequently within a short time period may be an indication that memory is failing. In another example, error notification messages occurring around the same time period as other physical anomalies (e.g., thermal events, voltage droop, etc.) may be an indication that the accelerators are overly active. In another example, notification messages for an illegal instruction error being executed before a forward branch error (based on the timestamps) may provide a better understanding of the operational flow of the integrated circuit which may be helpful in debugging.

The counter identifier may be used to identify one of multiple counters that can be maintained by the integrated circuit, and the counter value can include a value of the counter at the time the notification message is generated. For example, the counter may be one of the counters in the counters 410. As an example, the counter identifier can be four bits in order to identify up to sixteen counters. In some implementations, a configuration register can designate a counter that is to be used for error notification messages. Alternatively or additionally, the notification messages may always use a particular counter, can use the last counter that was incremented or decremented, or another technique can be used to specify the counter.

In various examples, a counter can be associated with a specific condition. For example, when a certain error occurs repeatedly, the counter can be incremented or decremented to count each occurrence. As another example, a counter that is not associated with an error can be captured. For example, a counter may be used to count iterations of a loop or repeated execution of a particular set of operations. In this example, capturing a counter value in the error notification messages can assist in debugging a problem with this code or a problem that happens to occur during the execution of this code.

In some examples, the metadata 414a field for an event notification message may include an event identifier, the counter identifier, and the counter value. The event identifier may be used to identify different events. In some implementations, the integrated circuit may have as many as 256 event registers, as an example. The event identifier can identify which of the event registers underwent a change of status.

In the illustrated example, the phase bit 414e, the HW queue overflow bit 414d, and the SW queue overflow bit 414c may be single-bit indicators. As discussed above, the phase bit 414e may be used by software to see whether the notification queue has a new notification message. For example, firmware executing on the microcontroller 110 can periodically check a queue entry indicated by a head pointer to see if the phase bit in the entry is set to the current phase value. In this example, when the firmware finds the previous phase value, the firmware knows that the entry is storing an old notification message, and when the firmware finds the current phase value, the firmware knows the entry is storing a new notification message. The HW queue overflow bit 414c can indicate that a hardware queue is full and additional notification messages could not be added to the queue. The hardware queue can be, for example, a queue in the system notification write interface 316 or the user notification write interface 312, which the integrated circuit may use to store notification messages until the notification messages can be sent from the integrated circuit. The HW queue overflow bit 414c can be set, for example, in the last notification message that the hardware queue can accept before becoming full.

The SW queue overflow bit 414d may be set to indicate that a queue in the memory has become full, and that some notification messages for the queue are being dropped. The SW queue overflow bit 414d can be set, for example, in the last notification message that the queue can accept before becoming full. In some cases, a queue may become full, and the integrated circuit may have more notification messages to add to the queue. The queue may have become full, for example, because the integrated circuit is generating notification messages for the queue at a faster rate than the driver 116, or the microcontroller 116 is reading the notification messages out, the queue is too small for the number of notification messages that the integrated circuit is generating, the integrated circuit is experiencing a problem and is generating too many notification messages, or for another reason.

The timestamp 414f can include a value obtained from the timestamp counter in the counters 410. In various examples, all notification messages may receive a timestamp from the same timestamp counter. Additionally, notification messages that are triggered in the same clock cycle can receive the same timestamp. The timestamp 414f can thus be used to relate one notification message to another. In some instances, the current timestamp register may be read to determine a current value of the timestamp relative to the timestamps included in the notification messages. For example, in some instances, the timestamp may indicate a point in time an error was generated or the status of an event register for an event was changed. In various examples, the notification message generator 402 may adjust the timestamp in the notification message 414 to compensate for few cycles elapsed (e.g., less than five) between the detection of the error or the event status change and a current timestamp value. The notification message 114 may be used by the microcontroller 110 to monitor the operational and physical health of the offload engine 108 during runtime. In some examples, the timestamp 414f can be 64 bits wide.

Figure 6:
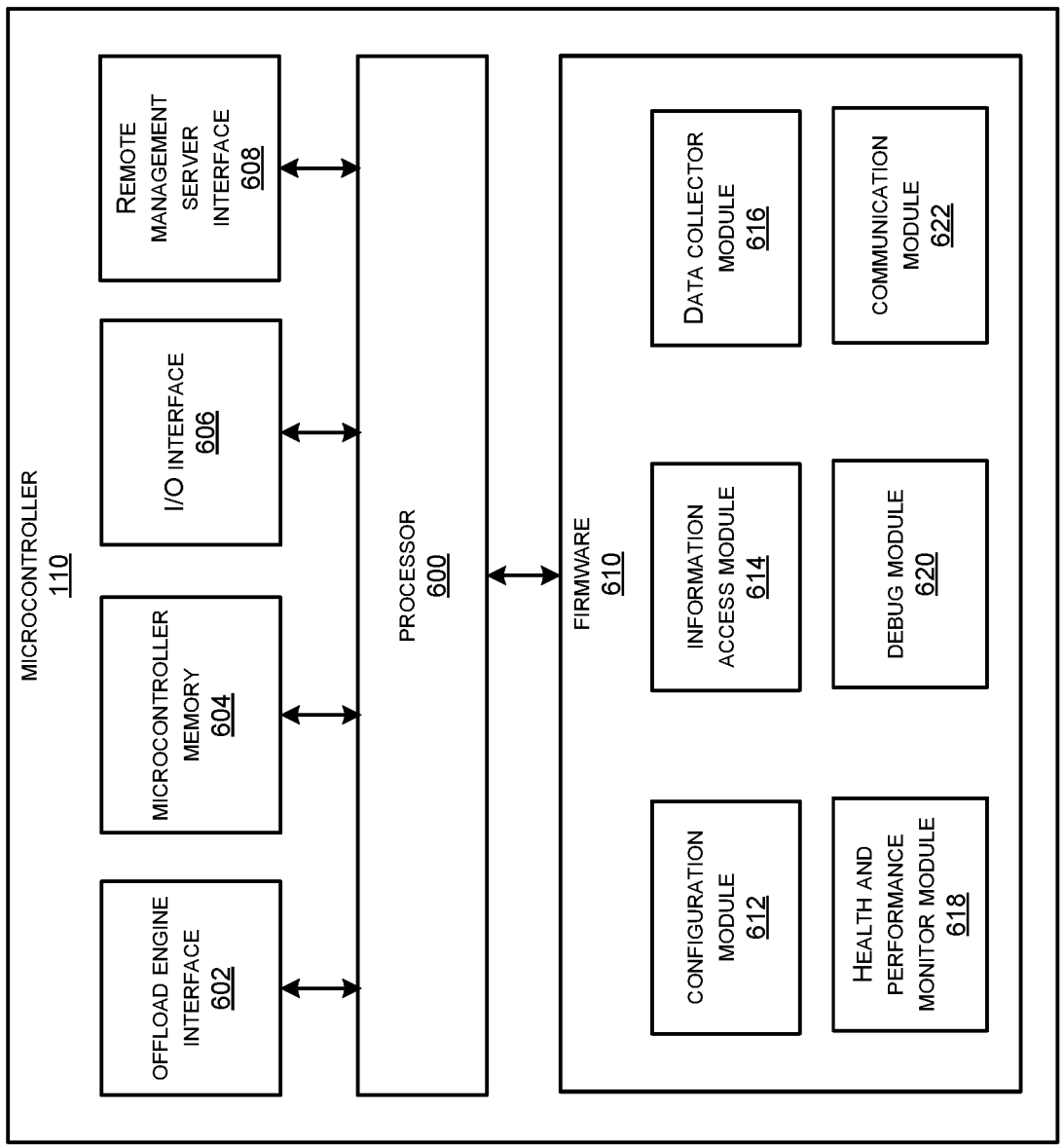
FIG. 6 illustrates an example block diagram for a microcontroller in the computing system, according to certain embodiments.

FIG. 6 illustrates an example block diagram for the microcontroller 110, according to certain embodiments.

The microcontroller 110 may include a processor 600 configured to execute firmware 610 to perform operational management and debug of the offload engine 108. The processor 600 may be coupled to an offload engine interface 602, a microcontroller memory 604, an I/O interface 606, and a remote management server interface 608.

The processor 600 may include one or more processor cores configured to execute instructions. For example, the instructions may be in the form of firmware 610. The firmware 610 may be stored in a RAM, ROM, flash memory, EEPROM, or any suitable memory configured to store instructions that can be executed by the processor 600. The firmware 610 may include a configuration module 612, an information access module 614, a data collector module 616, a health and performance monitor module 618, a debug module 620, and a communication module 622.

The offload engine interface 602 may be configured to allow communication between the microcontroller 110 and the offload engine 108. In some implementations, the offload engine interface 602 may be based on a synchronous serial interface protocol, e.g., the serial peripheral interface (SPI).

The microcontroller memory 604 may include a RAM or another type of volatile memory. In some implementations, the microcontroller memory 604 may be an independent device or part of another memory. The microcontroller memory 604 may include one or more queues to store one or more types of notification messages. The notification messages may be the system notification message 320 as discussed with reference to FIG. 3. In some implementations, the microcontroller memory 604 may include an error notification queue to store error notification messages and an event notification queue to store event notification messages. In some embodiments, the error notification queue and the event notification queue may be configured by writing to corresponding configuration registers in the system configuration registers 308a. For example, writing to the corresponding configuration registers may include configuring a base address, size, pointers, etc. for each queue.

The I/O interface 606 may include one or more interfaces to one or more I/O devices. For example, the I/O devices may include the BMC 118. In some implementations, the I/O interface 606 may include an interrupt interface to receive interrupts from various I/O devices on the PCIe card, e.g., voltage sensors, clock controllers, temperature sensors, etc. In some implementations, the I/O interface 606 may be used to receive interrupts when there is a change in the physical health parameters of the PCIe card (e.g., temperature, humidity, airflow, etc.), which may be used by the microcontroller 110 to monitor physical health of the PCIe card. The interrupts may be generated in addition to or in place of notification messages generated due to the change in physical health parameters outside a certain range. For example, the change in the physical health parameters may correspond to an increase in the temperature of the PCIe card, a sharp drop in the voltage, among other examples.

The remote management server interface 608 may be configured to enable communication with the remote management server 122 via the network 120 as discussed in FIG. 1. For example, the remote management server interface 608 may be used to communicate with the network controller 120 over the Ethernet. In some embodiments, the remote management server interface 608 may be based on an API based protocol, for example, constrained application protocol (CoAP), or REST, to communicate with the remote management server 122 over the Ethernet. As discussed previously, the remote management server 122 may execute fleet management software to configure and manage the accelerator devices 106 on various servers.

The configuration module 612 may be used to configure the integrated circuit. For example, the configuration module 612 may be used to write the system configuration registers 308a to configure the notification queues, or to enable the generation of notification messages. The configuration module 612 may also be used to initialize different components of the offload engine 108, e.g., the data movement processors 206a-206p, the accelerators 202a-202n, the memory controllers 214, by writing to associated registers after power on reset. In some examples, the configuration module 612 may run some test runs on the PCIe card after initialization to test the default configuration. Once the PCIe card is initialized and tested, the driver 116 executing on the host processor can configure the user registers 306 to start running user workloads on the accelerators 202a-202n.

The information access module 614 may be configured to access the information associated with a notification message received by the microcontroller 110 in the microcontroller memory 604. In some implementations, the information access module 614 may access the phase value 414e of the notification message to determine the receipt of a new notification message. For example, initially, before any notifications are received, each entry in the error notification queue and the event notification queue may be zero. In this example, when the integrated circuit starts to send notification messages, the integrated circuit can set the phase value 414e in each notification message to one. The information access module 614 may then periodically check the queue entry pointed to by a pointer to see if the phase value 414e has been changed from zero to one, and when the phase value 414e changes to one, it may be an indication of a new notification message as pointed to by the pointer. The information access module 614 may then access the information associated with the notification message 414. For example, the information access module 614 may access the timestamp 414f, the notification type 414b, and the metadata 414a associated with the notification type 414b from the notification message 414.

The information access module 614 may also be used to read the system CSRs 308b and the system statistics registers 308c. The information access module 614 may read the registers periodically, or based on the notification type 414b and the metadata 414a upon receiving the notification message 414. Reading the system statistics registers 308c may provide information on the number of cycles an integrated circuit has been active, whether the integrated circuit has been in the wait cycle for a long period of time, whether any events are being set, whether there are a large number of errors in a short period of time, or other runtime operation information. For example, if the notification type 414b indicates an error notification message, the information access module 614 may read the current execution state register in the system CSRs 308b or the current timestamp register. Furthermore, depending on the error identifier in the metadata 414a, the information access module 614 may read a register in the system statistics registers 308c to get additional information that may be related to the error. In another example, reading the system statistics registers 308c may also provide information that can be used for performance monitoring. For example, by reading certain system statistics registers 308c occasionally or periodically, a count for number of instructions executing per cycle may be determined. If an integrated circuit is active but the number of cycles per second is zero for a long period of time, it might be an indication of a defect in the integrated circuit.

The data collector module 616 may be configured to collect data based on the information associated with each notification message received over a period of time. For example, the data collector module 616 may collect data read by the information access module 614 from each notification message received over a period of time. The data collector module 616 may also collect data from one or more registers in the system CSRs 308b and the system statistics registers 308c read by the information access module 614 based on the contents of the notification messages received over that period of time or periodically.

The health and performance monitor module 618 may be configured to monitor the operational health and performance of the offload engine 108 based on the information associated with the notification messages received by the microcontroller 110 or by periodically reading the system statistics registers 308c. In some examples, the health and performance monitor module 618 may use the collected data to build a timeline using the timestamps in the notification messages received over the period of time. In various examples, the collected data may also include one or more interrupts received by the microcontroller 110 via the I/O interface 606 due to changes in the physical health parameters of the PCIe card. The health and performance monitor module 618 may determine whether or not a certain threshold for the health and performance is met based on the timeline. The threshold may be provided by the remote management server 122. In some examples, the health and performance monitor module 618 may use the statistics from the system statistics registers 308c to measure a performance of the offload engine 108. For example, based on counts of the number of instructions executed, the number of cycles in the active running state, and the number of cycles in the idle running state, the health and performance monitor module 618 may determine the performance for the offload engine 108 using the timeline.

The debug module 620 may be used for debugging the offload engine 108 in instances when the performance or the health of the offload engine 108 is outside an acceptable range based on the threshold. The debug module 620 may help identify a component of the integrated circuit device in the offload engine 108, which may be defective or may not be performing optimally. In some examples, the debug module 620 may access one or more registers in the offload engine 108 to test a particular accelerator or the data movement processor while other accelerators and the data movement processors are still executing. For example, the debug module 620 may reconfigure or disable a certain component in the offload engine 108 to identify a cause of an unexpected behavior of the offload engine 108. In some instances, once the problem with a faulty device has been identified and resolved, it can be redeployed in the system.

The communication module 622 may be used to communicate with the remote management server 122. For example, the microcontroller 110 may send the information associated with the notification messages to the remote management server 122 for analysis. In some embodiments, the communication module 622 may be used to send the collected data by the data collector module 616 to the remote management server 122. The remote management server 122 may build a timeline based on the collected data and send new configuration values to the microcontroller 110 via the remote management server interface 608. The new configuration values can be used by the configuration module 616 to reconfigure certain registers in the offload engine 108 for debugging or for performance evaluation. For example, the new configuration values may be used to reconfigure one or more of the accelerators 202a-202n, data movement processors 206a-206p, I/O controllers 210, DMA engines 212, or memory controllers 214. In some examples, based on the timeline, the remote management server 122 may determine if a particular accelerator needs to be shut down or the workload needs to be redistributed among the accelerators. In some examples, the new configuration values can be used by the configuration module 612 to reconfigure one or more data movement processor 206a-206p or the accelerators 202a-202n. In some examples, the remote management server 122 may reset one or more components of the offload engine 108 via the communication module 622 or through the BMC 118.

Figure 7:
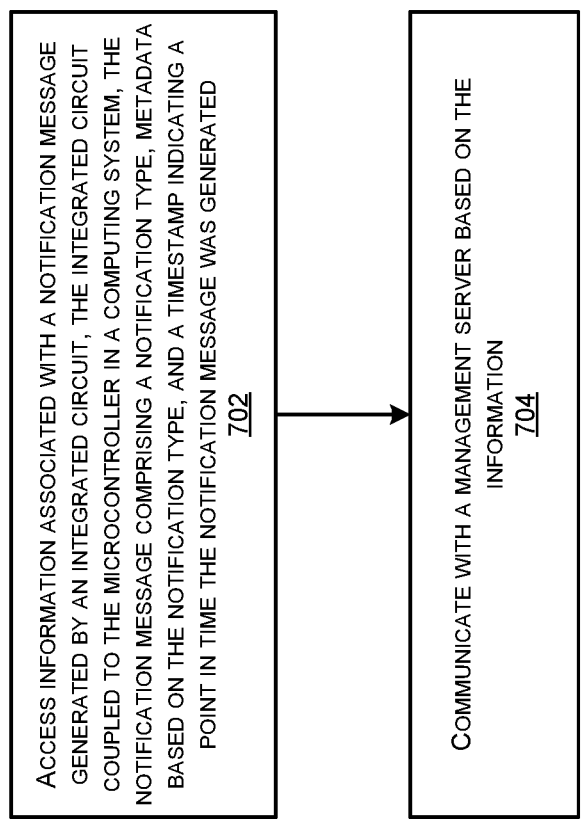
FIG. 7 illustrates an example method executed by a microcontroller to perform operational management of an integrated circuit device, according to certain embodiments.

FIG. 7 illustrates an example method executed by a microcontroller to perform operational management of an integrated circuit device, according to certain embodiments. For example, the microcontroller 110 may perform operational management of the offload engine 108 as discussed with reference to FIG. 1.

In step 702, the microcontroller 110 may access information associated with a notification message generated by an integrated circuit. For example, the microcontroller 110 may access information associated with the system notification message 320 generated by one of the data movement processor 206a-206p or the accelerators 202a-202n of FIG. 2. For example, the system notification message 320 may have been generated by the notification management 204a in the accelerator 202a. Accessing the information may include accessing the contents of the notification message. For example, as shown in FIG. 5, the access information module 614 may access the notification type 414b, the metadata 414a, and the timestamp 414f from the notification message 414. As an example, the notification type 414b may indicate an error notification, and the metadata 414a may indicate a type of the error based on the error identifier. The timestamp 414f may indicate a point in time the notification message was generated.

In some examples, accessing the information may also include accessing one or more registers in the accelerator 202a. For example, based on the error identifier in the metadata 414a, the information access module 614 of FIG. 6 may access certain registers in the system control and status registers 308b or the system statistics registers 308c in FIG. 3. As an example, the error may relate to a timeout on a wait instruction as indicated by the error identifier. The information access module 614 may read one of the registers in the system statistics registers 308c that counts the number of cycles in the waiting state. Based on the number of cycles in the waiting state, the health and performance monitor module 618 may determine the number of cycles in the waiting state when the timeout error happened in the waiting state.

In some examples, the microcontroller 110 may collect data based on the information associated with each notification message received over a period of time. For example, the data collector module 616 may collect data based on the notification type 414b, the metadata 414a, and the timestamp 414f in each notification message received over a period of time. The health and performance monitor module 618 may determine that the accelerator 202a is not operating within a threshold based on a timeline built using the collected data. As an example, if the error is a correctable ECC error as indicated by the error identifier, the health and performance monitor module 618 may determine that the accelerator 202a is not operating within a threshold if the number of correctable ECC errors generated within a time period is more than a threshold. Thus, cross referencing the information received from the notification messages, read from various registers and from the collected data, may be used to measure the operational health and performance of the integrated circuit against the threshold.

In step 704, the microcontroller may communicate with a management server based on the information. For example, the management server may be the remote management server 122 and the microcontroller 110 may communicate with the remote management server 122 via the network controller 112 based on the information. Thus, the microcontroller 110 may communicate with the remote management server 122 using the remote management server interface 608 if the accelerator 202a is not operating within a threshold. For example, as discussed above, based on the information, if the number of cycles in the waiting state is more than a threshold for a first error type, or if the number of correctable ECC errors generated within a time period are more than a threshold for a second error type, the microcontroller 110 may send the collected data to the remote management server 122 for analysis using the communication module 622. The remote management server 122 may provide new configuration values to reconfigure the accelerator 202a, reset the accelerator 202a, or shut down the accelerator 202a and redistribute the workload running on the accelerator 202a to another accelerator, e.g., the accelerator 202n. In some examples, the debug module 620 may debug the accelerator 202a by configuring the accelerator 202a for testing while the other components of the offload engine 108 are still operating.

As discussed with reference to FIGS. 1-7, use of notification messages to monitor operational and physical health of integrated circuits can allow early detection of problems so that timely actions can be taken to minimize user impact. Additionally, as compared to an interrupt, the notification message may not need immediate attention of a processor, and can be handled when the processor has time to read the notification message. The timestamps in the notification messages collected over a period of time can be used to build a timeline which can provide visibility into the internal operation of the integrated circuit for debugging and performance monitoring purposes. Furthermore, certain embodiments can allow debugging an integrated circuit device during runtime execution of other integrated circuit devices, thus minimizing the system downtime.

Figure 8:
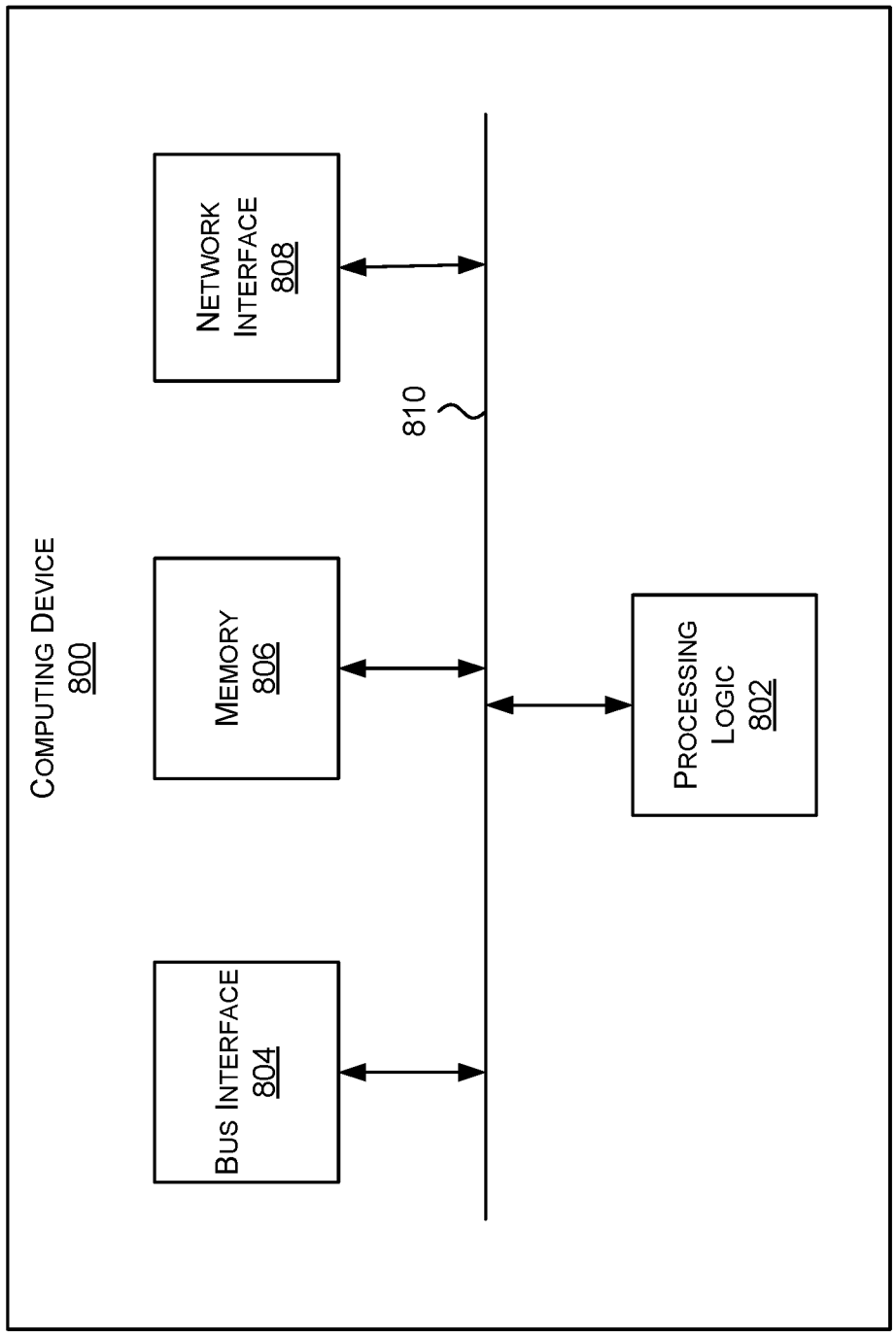
FIG. 8 illustrates an example of a computing device, according to certain aspects of the disclosure.

FIG. 8 illustrates an example of a computing device 800. Functionality and/or several components of the computing device 800 may be used without limitation with other embodiments disclosed elsewhere in this disclosure, without limitations. The computing device 800 may perform computations to facilitate processing of a task. As an illustrative example, the computing device 800 can be part of a computing system 102 in FIG. 1.

In one example, the computing device 800 may include processing logic 802, a bus interface 804, memory 806, and a network interface 808. These components may be hardware modules, software modules, or a combination of hardware and software. In certain instances, components may be interchangeably used with modules or engines, without deviating from the scope of the disclosure. The computing device 800 may include additional components, not illustrated here. In some implementations, the computing device 800 may include fewer components. In some implementations, one or more of the components may be combined into one module. One or more of the components may be in communication with each other over a communication channel 810. The communication channel 810 may include one or more busses, meshes, matrices, fabrics, a combination of these communication channels, or some other suitable communication channel.

The processing logic 802 may include one or more integrated circuits, which may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 802 may include processors developed by ARM®, MIPS®, AMD®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 802 may be stored on a computer-readable storage medium, for example, in the form of a computer program. The computer-readable storage medium may be non-transitory. In some cases, the computer-readable medium may be part of the memory 806. The processing logic 802 may include components or functionalities similar to the microcontroller 110 in FIG. 6.

The memory 806 may include either volatile or non-volatile, or both volatile and non-volatile types of memory. The memory 806 may, for example, include random access memory (RAM), read only memory (ROM), Electrically Erasable Programmable Read-Only Memory (EEPROM), flash memory, and/or some other suitable storage media. In some cases, some or all of the memory 806 may be internal to the computing device 800, while in other cases some or all of the memory may be external to the computing device 800. The memory 806 may store an operating system comprising executable instructions that, when executed by the processing logic 802, provides the execution environment for executing instructions providing data processing functionality for the computing device 800. The memory 806 may also include the memory 112, or the microcontroller memory 604. For example, the memory 806 may store one or more notification queues for storing the user notification message 318 or the system notification message 316 as discussed in FIG. 3.

The bus interface 804 may enable communication with external entities, such as a host device and/or other components in a computing system (e.g., the host processor 104 or the BMC 118), over an external communication medium. The bus interface 804 may include a physical interface for connecting to a cable, socket, port, or other connection to the external communication medium. The bus interface 804 may further include hardware and/or software to manage incoming and outgoing transactions. The bus interface 804 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface 804 may include the physical layer for any of these bus protocols, including a connector, power management, and error handling, among other things. In some implementations, the computing device 800 may include multiple bus interface modules for communicating with multiple external entities. These multiple bus interface modules may implement the same local bus protocol, different local bus protocols, or a combination of the same and different bus protocols.

The network interface 808 may include hardware and/or software for communicating with a network. This network interface 808 may, for example, include physical connectors or physical ports for wired connection to a network, and/or antennas for wireless communication to a network. The network interface 808 may further include hardware and/or software configured to implement a network protocol stack. The network interface 808 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing device 800 may include multiple network interface modules, each configured to communicate with a different network. For example, in these implementations, the computing device 800 may include a network interface module for communicating with a wired Ethernet network, a wireless 802.11 network, a cellular network, an Infiniband network, etc. In some embodiments, computing device 800 may communicate with the remote management server 122 through the network interface 808.

The various components and modules of the computing device 800, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as pattern recognition, audio processing, video processing, search enquiries, etc. In some embodiments of the technology, the SoC or other component may include multiple subsystems as disclosed herein.

Figure 9:
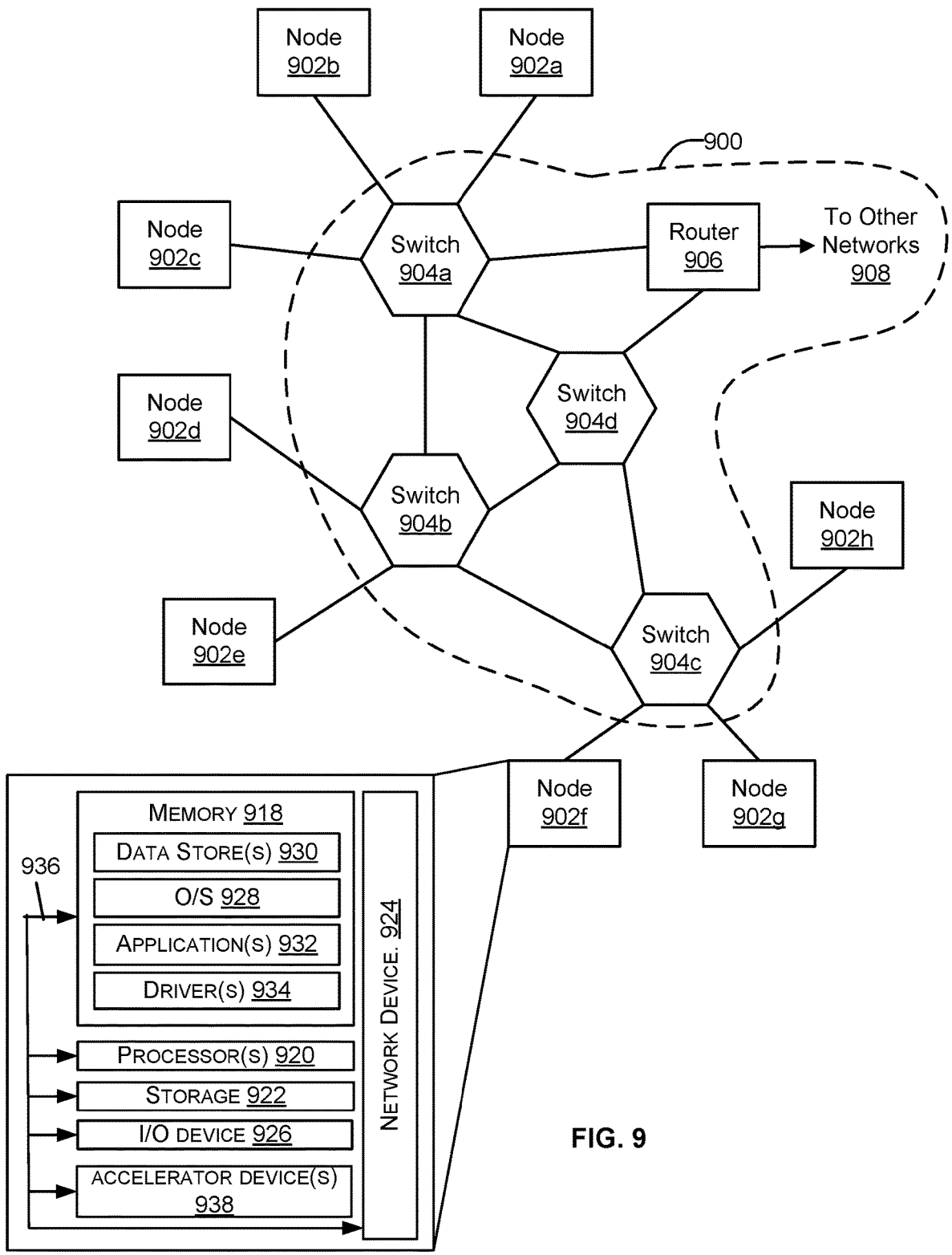
FIG. 9 illustrates an example architecture for features and systems described herein that includes one or more service provider computers and/or a user device connected via one or more networks, according to certain aspects of the disclosure.

FIG. 9 illustrates a network 900, illustrating various different types of nodes comprising one or more computing devices similar to the computing device 800 of FIG. 8. In certain embodiments, the network 900 may be based on a switched architecture with point-to-point links. As illustrated in FIG. 9, the network 900 includes a plurality of switches 904a-904d, which may be arranged in a network. In some cases, the switches are arranged in a multi-layered network, such as a Clos network. A network device that filters and forwards packets between local area network (LAN) segments may be referred to as a switch. Switches generally operate at the data link layer (layer 2) and sometimes the network layer (layer 3) of the Open System Interconnect (OSI) Reference Model and may support several packet protocols. Switches 904a-904d may be connected to a plurality of nodes 902a-902h and provide multiple paths between any two nodes.

The network 900 may also include one or more network devices for connection with other networks 908, such as other subnets, LANs, wide area networks (WANs), or the Internet, and may be referred to as routers 906. Routers use headers and forwarding tables to determine the best path for forwarding the packets, and use protocols such as internet control message protocol (ICMP) to communicate with each other and configure the best route between any two devices.

In some examples, network(s) 900 may include any one or a combination of many different types of networks, such as cable networks, the Internet, wireless networks, cellular networks and other private and/or public networks. Interconnected switches 904a-904d and router 906, if present, may be referred to as a switch fabric, a fabric, a network fabric, or simply a network. In the context of a computer network, terms "fabric" and "network" may be used interchangeably herein.

Nodes 902a-902h may be any combination of host systems, processor nodes, storage subsystems, and I/O chassis that represent user devices, service provider computers or third party computers.

User devices may include computing devices to access an application 932 (e.g., a web browser or mobile device application). In some aspects, the application 932 may be hosted, managed, and/or provided by a computing resources service or service provider. The application 932 may allow the user(s) to interact with the service provider computer(s) to, for example, access web content (e.g., web pages, music, video, etc.). The user device(s) may be a computing device such as for example a mobile phone, a smart phone, a personal digital assistant (PDA), a laptop computer, a netbook computer, a desktop computer, a thin-client device, a tablet computer, an electronic book (e-book) reader, a gaming console, etc. In some examples, the user device(s) may be in communication with the service provider computer(s) via the other network(s) 908. Additionally, the user device(s) may be part of the distributed system managed by, controlled by, or otherwise part of the service provider computer(s) (e.g., a console device integrated with the service provider computers).

The node(s) of FIG. 9 may also represent one or more service provider computers. One or more service provider computers may provide a native application that is configured to run on the user devices, which user(s) may interact with. The service provider computer(s) may, in some examples, provide computing resources such as, but not limited to, client entities, low latency data storage, durable data storage, data access, management, virtualization, cloud-based software solutions, electronic content performance management, and so on. The service provider computer(s) may also be operable to provide web hosting, databasing, computer application development and/or implementation platforms, combinations of the foregoing or the like to the user(s). In some embodiments, the service provider computer(s) may be provided as one or more virtual machines implemented in a hosted computing environment. The hosted computing environment may include one or more rapidly provisioned and released computing resources. These computing resources may include computing, networking and/or storage devices. A hosted computing environment may also be referred to as a cloud computing environment. The service provider computer(s) may include one or more servers, perhaps arranged in a cluster, as a server farm, or as individual servers not associated with one another and may host the application 932 and/or cloud-based software services. These servers may be configured as part of an integrated, distributed computing environment. In some aspects, the service provider computer(s) may, additionally or alternatively, include computing devices such as for example a mobile phone, a smart phone, a personal digital assistant (PDA), a laptop computer, a desktop computer, a netbook computer, a server computer, a thin-client device, a tablet computer, a gaming console, etc. In some instances, the service provider computer(s), may communicate with one or more third party computers.

In one example configuration, the node(s) 902a-902h may include at least one memory 918 and one or more processing units (or processor(s) 920). The processor(s) 920 may be implemented in hardware, computer-executable instructions, firmware, or combinations thereof. Computer-executable instruction or firmware implementations of the processor(s) 920 may include computer-executable or machine-executable instructions written in any suitable programming language to perform the various functions described.

In some instances, the hardware processor(s) 920 may be a single core processor or a multi-core processor. A multi-core processor may include multiple processing units within the same processor. In some embodiments, the multi-core processors may share certain resources, such as buses and second or third level caches. In some instances, each core in a single or multi-core processor may also include multiple executing logical processors (or executing threads). In such a core (e.g., those with multiple logical processors), several stages of the execution pipeline and also lower level caches may also be shared.

The memory 918 may store program instructions that are loadable and executable on the processor(s) 920, as well as data generated during the execution of these programs. Depending on the configuration and type of the node(s) 902a-902h, the memory 918 may be volatile (such as RAM) and/or non-volatile (such as ROM, flash memory, etc.). The memory 918 may include an operating system 928, one or more data stores 930, one or more application programs 932, one or more drivers 934, and/or services for implementing the features disclosed herein.

The operating system 928 may support nodes 902a-902h basic functions, such as scheduling tasks, executing applications, and/or controller peripheral devices. In some implementations, a service provider computer may host one or more virtual machines. In these implementations, each virtual machine may be configured to execute its own operating system. Examples of operating systems include Unix, Linux, Windows, Mac OS, iOS, Android, and the like. The operating system 928 may also be a proprietary operating system.

The data stores 930 may include permanent or transitory data used and/or operated on by the operating system 928, application programs 932, or drivers 934. Examples of such data include web pages, video data, audio data, images, user data, and so on. The information in the data stores 930 may, in some implementations, be provided over the network(s) 908 to user devices 904. In some cases, the data stores 930 may additionally or alternatively include stored application programs and/or drivers. Alternatively or additionally, the data stores 930 may store standard and/or proprietary software libraries, and/or standard and/or proprietary application user interface (API) libraries. Information stored in the data stores 930 may be machine-readable object code, source code, interpreted code, or intermediate code.

The drivers 934 include programs that may provide communication between components in a node. For example, some drivers 934 may provide communication between the operating system 928 and additional storage 922, network device 924, and/or I/O device 926. Alternatively or additionally, some drivers 934 may provide communication between application programs 932 and the operating system 928, and/or application programs 932 and peripheral devices accessible to the service provider computer. In many cases, the drivers 934 may include drivers that provide well-understood functionality (e.g., printer drivers, display drivers, hard disk drivers, Solid State Device drivers). In other cases, the drivers 934 may provide proprietary or specialized functionality.

The service provider computer(s) or servers may also include additional storage 922, which may include removable storage and/or non-removable storage. The additional storage 922 may include magnetic storage, optical disks, solid state disks, flash memory, and/or tape storage. The additional storage 922 may be housed in the same chassis as the node(s) 902a-902h or may be in an external enclosure. The memory 918 and/or additional storage 922 and their associated computer-readable media may provide non-volatile storage of computer-readable instructions, data structures, program modules, and other data for the computing devices. In some implementations, the memory 918 may include multiple different types of memory, such as SRAM, DRAM, or ROM.

The memory 918 and the additional storage 922, both removable and non-removable, are examples of computer-readable storage media. For example, computer-readable storage media may include volatile or non-volatile, removable or non-removable media implemented in a method or technology for storage of information, the information including, for example, computer-readable instructions, data structures, program modules, or other data. The memory 918 and the additional storage 922 are examples of computer storage media. Additional types of computer storage media that may be present in the node(s) 902a-902h may include, but are not limited to, PRAM, SRAM, DRAM, RAM, ROM, EEPROM, flash memory or other memory technology, CD-ROM, DVD or other optical storage, magnetic cassettes, magnetic tape, magnetic disk storage or other magnetic storage devices, solid state drives, or some other medium which can be used to store the desired information and which can be accessed by the node(s) 902a-902h. Computer-readable media also includes combinations of any of the above media types, including multiple units of one media type.

Alternatively or additionally, computer-readable communication media may include computer-readable instructions, program modules or other data transmitted within a data signal, such as a carrier wave or other transmission. However, as used herein, computer-readable storage media does not include computer-readable communication media.

The node(s) 902a-902h may also include I/O device(s) 926, such as a keyboard, a mouse, a pen, a voice input device, a touch input device, a display, speakers, a printer, and the like. The node(s) 902a-902h may also include one or more communication channels 936. A communication channel 936 may provide a medium over which the various components of the node(s) 902a-902h can communicate. The communication channel or channels 936 may take the form of a bus, a ring, a switching fabric, or a network.

The node(s) 902a-902h may also include accelerator device(s) 938. The accelerator device(s) 938 may be similar to the accelerator devices 106 in FIG. 1. For example, the accelerator device(s) 938 may be configured to generate notification messages that can be used to provide operational management of each node.

The node(s) 902a-902h may also contain network device(s) 924 that allow the node(s) 902a-902h to communicate with a stored database, another computing device or server, user terminals and/or other devices on the network(s) 900. The network device(s) 924 of FIG. 9 may include similar components discussed with reference to the network device 800 of FIG. 8.

In some implementations, the network device 924 is a peripheral device, such as a PCI-based device. In these implementations, the network device 924 includes a PCI interface for communicating with a host device. The term "PCI" or "PCI-based" may be used to describe any protocol in the PCI family of bus protocols, including the original PCI standard, PCI-X, Accelerated Graphics Port (AGP), and PCI-Express (PCIe) or any other improvement or derived protocols that are based on the PCI protocols discussed herein. The PCI-based protocols are standard bus protocols for connecting devices, such as a local peripheral device to a host device. A standard bus protocol is a data transfer protocol for which a specification has been defined and adopted by various manufacturers. Manufacturers ensure that compliant devices are compatible with computing systems implementing the bus protocol, and vice versa. As used herein, PCI-based devices also include devices that communicate using Non-Volatile Memory Express (NVMe). NVMe is a device interface specification for accessing non-volatile storage media attached to a computing system using PCIe. For example, the bus interface module 808 may implement NVMe, and the network device 924 may be connected to a computing system using a PCIe interface.

A PCI-based device may include one or more functions. A "function" describes operations that may be provided by the network device 924. Examples of functions include mass storage controllers, network controllers, display controllers, memory controllers, serial bus controllers, wireless controllers, and encryption and decryption controllers, among others. In some cases, a PCI-based device may include more than one function. For example, a PCI-based device may provide a mass storage controller and a network adapter. As another example, a PCI-based device may provide two storage controllers, to control two different storage resources. In some implementations, a PCI-based device may have up to eight functions.

In some implementations, the network device 924 may include single-root I/O virtualization (SR-IOV). SR-IOV is an extended capability that may be included in a PCI-based device. SR-IOV allows a physical resource (e.g., a single network interface controller) to appear as multiple resources (e.g., sixty-four network interface controllers). Thus, a PCI-based device providing a certain functionality (e.g., a network interface controller) may appear to a device making use of the PCI-based device to be multiple devices providing the same functionality. The functions of an SR-IOV-capable storage adapter device may be classified as physical functions (PFs) or virtual functions (VFs). Physical functions are fully featured functions of the device that can be discovered, managed, and manipulated. Physical functions have configuration resources that can be used to configure or control the storage adapter device. Physical functions include the same configuration address space and memory address space that a non-virtualized device would have. A physical function may have a number of virtual functions associated with it. Virtual functions are similar to physical functions, but are light-weight functions that may generally lack configuration resources, and are generally controlled by the configuration of their underlying physical functions. Each of the physical functions and/or virtual functions may be assigned to a respective thread of execution (such as for example, a virtual machine) running on a host device.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 8, FIG. 9, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system for providing operational management of an integrated circuit, the system comprising:
    the integrated circuit configured to offload certain operations from a host processor, the integrated circuit comprising:
        a first set of statistics registers configured to store statistics associated with various runtime operations of the integrated circuit, the first set of statistics registers accessible by a microcontroller coupled to the integrated circuit;
        a first notification generator configured to generate a first notification message during the runtime operations of the integrated circuit, the first notification message comprising a first timestamp indicating a point in time the first notification message was generated, a first notification type, and a first metadata based on the first notification type; and
        a first write interface configured to write the first notification message in a first memory accessible by the microcontroller; and
    the microcontroller configured to execute firmware comprising:
        an information access module configured to access information associated with the notification message;
        a data collector module configured to collect data based on the information associated with each notification message generated over a period of time or the first set of statistics registers;
        a health and performance monitor module configured to determine whether the integrated circuit is operating within a threshold based on the collected data; and
        a communication module configured to send a portion of the collected data to a remote management server via a network interface.

2. The system of claim 1, the integrated circuit further comprising:
    a second set of statistics registers configured to store associated with the various runtime operations of the integrated circuit, the second set of statistics registers accessible by a driver executing on the host processor;
    a second notification generator configured to generate a second notification message during the runtime operations of the integrated circuit, the second notification message comprising a second timestamp indicating a point in time the second notification message was generated; and
    a second write interface configured to write the second notification message in a second memory accessible by the host processor.

3. The system of claim 1, wherein the first notification message is generated upon detection of an error in the integrated circuit, and wherein the first write interface is configured to write the first notification message in a notification queue in the first memory.

4. The system of claim 1 further comprising a baseboard management controller (BMC) configured to communicate with the remote management server via the network interface information related to physical health of the integrated circuit.

5. An apparatus comprising:
an integrated circuit configured to generate a notification message during runtime operation of the integrated circuit, the notification message comprising a timestamp indicating a point in time the notification message was generated; and
a microcontroller coupled to the integrated circuit, the microcontroller configured to:
access information associated with the notification message; and
communicate with a management server based on the information,
wherein the integrated circuit is further configured to write the notification message in memory accessible by the microcontroller, and wherein the notification message further comprises a notification type and metadata based on the notification type,
wherein accessing the information includes reading one or more registers from a plurality of registers in the integrated circuit based on the notification type and the metadata.

6. The apparatus of claim 5,
wherein accessing the information further includes accessing the timestamp, the notification type and the metadata from the notification message stored in the memory.

7. The apparatus of claim 5, wherein the notification type indicates an error notification and the metadata includes an error identifier for an error detected in the integrated circuit.

8. The apparatus of claim 5, wherein the notification type indicates an event notification for a change in status of an event internal or external to the integrated circuit.

9. The apparatus of claim 5, wherein the plurality of registers include statistics registers accessible by the microcontroller.

10. The apparatus of claim 5, wherein the microcontroller is further configured to:
collect data based on the information associated with each notification message received over a period of time,
wherein communicating with the management server includes sending a portion of the collected data to the management server for analysis.

11. The apparatus of claim 10, wherein the management server reconfigures the integrated circuit based on the analysis.

12. The apparatus of claim 11, wherein reconfiguration includes resetting the integrated circuit or writing one or more registers in the integrated circuit.

13. The apparatus of claim 10, wherein communicating with the management server further includes:
receiving, from the management server, results of the analysis, and
wherein the microcontroller is further configured to reconfigure the integrated circuit based on the results of the analysis.

14. The apparatus of claim 5, wherein the microcontroller is further configured to:
collect data based on the information associated with each notification message received over a period of time;
determine that the integrated circuit is not operating within a threshold based on a timeline built using the collected data, wherein the timeline is built by the microcontroller or by the management server; and
reconfigure the integrated circuit based on configuration information provided by the management server.

15. The apparatus of claim 14, wherein the threshold is based on performance or operational health of the integrated circuit.

16. The apparatus of claim 7, wherein the error corresponds to a change in physical health parameters of the integrated circuit outside of a certain range.

17. The apparatus of claim 5, wherein the integrated circuit is used to offload certain operations from a host processor in a computing system.

18. A method comprising:
accessing, by a microcontroller, information associated with a notification message generated by an integrated circuit, the integrated circuit coupled to the microcontroller in a computing system, wherein the notification message comprises a notification type, metadata based on the notification type, and a timestamp indicating a point in time the notification message was generated;
communicating, by the microcontroller, with a management server based on the information;
collecting data based on the information associated with each notification message received over a period of time;
determining that the integrated circuit is not operating within a threshold based on the collected data; and
debugging the integrated circuit by accessing one or more registers in the integrated circuit.

19. The method of claim 18, further comprising:
collecting data based on the information associated with each notification message received over a period of time;
determining that the integrated circuit is not performing within a threshold based on the collected data;
sending a portion of the collected data to the management server for analysis; and
reconfiguring the integrated circuit based on a result of the analysis.

* * * * *